(12) United States Patent
Mizuno et al.

(10) Patent No.: US 10,147,668 B2
(45) Date of Patent: Dec. 4, 2018

(54) STACKED COOLER

(71) Applicant: DENSO CORPORATION, Kariya, Aichi-pref. (JP)

(72) Inventors: Yasuhiro Mizuno, Kariya (JP); Isao Tamada, Kariya (JP); Tomohiro Shimazu, Kariya (JP); Hiroshi Hamada, Kayiya (JP); Yuusuke Takagi, Kariya (JP); Eiji Nakagawa, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 15/866,853

(22) Filed: Jan. 10, 2018

(65) Prior Publication Data

US 2018/0130721 A1 May 10, 2018

Related U.S. Application Data

(63) Continuation of application No. 14/914,580, filed as application No. PCT/JP2014/004442 on Aug. 28, 2014.

(30) Foreign Application Priority Data

Aug. 30, 2013 (JP) .................................. 2013-178800
Nov. 27, 2013 (JP) .................................. 2013-244981

(51) Int. Cl.
*H05K 7/20* (2006.01)
*H01L 23/473* (2006.01)
(Continued)

(52) U.S. Cl.
CPC ............ *H01L 23/473* (2013.01); *F28F 3/086* (2013.01); *F28F 9/26* (2013.01); *H01L 23/3675* (2013.01);
(Continued)

(58) Field of Classification Search
CPC ............... F28D 1/0333; F28D 1/05308; F28D 1/05358; F28D 1/0375; H01L 23/473;
(Continued)

(56) References Cited

U.S. PATENT DOCUMENTS 4,569,390 A * 2/1986 Knowlton ........... F28D 1/05366
165/149
5,148,863 A 9/1992 Fouts et al.
(Continued)

FOREIGN PATENT DOCUMENTS

JP 2002026215 A 1/2002
JP 2004205055 A 7/2004
(Continued)

OTHER PUBLICATIONS

International Search Report and Written Opinion (in Japanese with English Translation) for PCT/JP2014/004442, dated Dec. 2, 2014; ISA/JP.

*Primary Examiner* — Leonard R Leo
(74) *Attorney, Agent, or Firm* — Harness, Dickey & Pierce, P.L.C.

(57) ABSTRACT

A stacked cooler includes flow pipes that are stacked, each of the flow pipes having a flat shape and including a medium passage in which a heat medium flows, a heat exchange object that is disposed between each adjacent two of the flow pipes and is clamped between their flat planes, a protruding pipe part that is connected to at least one of the flow pipes and protrudes in a stacking direction of the flow pipes, and a load restraining part that restrains a load applied to a connection portion of the at least one of the flow pipes to the protruding pipe part as compared with a load applied to the other portion of the at least one of the flow pipes.

4 Claims, 17 Drawing Sheets

(51) Int. Cl.
| | |
|---|---|
| *H01L 23/40* | (2006.01) |
| *H01L 25/07* | (2006.01) |
| *H01L 25/18* | (2006.01) |
| *F28F 3/08* | (2006.01) |
| *F28F 9/26* | (2006.01) |
| *H01L 23/367* | (2006.01) |
| *H01L 25/11* | (2006.01) |
| *F28D 1/053* | (2006.01) |
| *F28F 9/013* | (2006.01) |
| *F28D 1/03* | (2006.01) |
| *F28F 9/007* | (2006.01) |

(52) U.S. Cl.
CPC ............ *H01L 23/40* (2013.01); *H01L 25/07* (2013.01); *H01L 25/074* (2013.01); *H01L 25/117* (2013.01); *H01L 25/18* (2013.01); *F28D 1/0333* (2013.01); *F28D 1/05308* (2013.01); *F28D 1/05358* (2013.01); *F28F 9/0075* (2013.01); *F28F 9/0131* (2013.01); *F28F 2225/04* (2013.01); *H01L 2924/0002* (2013.01); *H05K 7/20927* (2013.01)

(58) Field of Classification Search
CPC ........... H05K 7/20254; H05K 7/20309; H05K 7/20927; H05K 7/20933; F28F 9/26; F28F 9/0075; F28F 2225/00; F28F 2225/04
USPC .................. 165/153, 906, 80.4; 361/699
See application file for complete search history.

(56) References Cited

U.S. PATENT DOCUMENTS

| | | | |
|---|---|---|---|
| 5,447,194 | A | 9/1995 | Hayashi et al. |
| 5,513,700 | A * | 5/1996 | Kleve ............... F28D 1/0341 165/153 |
| 5,979,542 | A | 11/1999 | Inoue et al. |
| 6,220,343 | B1 | 4/2001 | Ichiyanagi |
| 6,247,523 | B1 | 6/2001 | Shibagaki et al. |
| 6,973,805 | B2 | 12/2005 | Higashiyama |
| 7,178,585 | B1 | 2/2007 | Mehendale et al. |
| 8,151,868 | B2 * | 4/2012 | Inagaki ............... F28D 1/0333 165/153 |
| 2001/0033477 | A1 | 10/2001 | Inoue et al. |
| 2005/0133210 | A1 | 6/2005 | Inagaki et al. |
| 2006/0243422 | A1 | 11/2006 | Sakai et al. |
| 2009/0008061 | A1 | 1/2009 | Inagaki et al. |

FOREIGN PATENT DOCUMENTS

| | | |
|---|---|---|
| JP | 2005142305 A | 6/2005 |
| JP | 2005228877 A | 8/2005 |
| JP | 2006005014 A | 1/2006 |
| JP | 2011228566 A | 11/2011 |
| JP | 2011228580 A | 11/2011 |
| JP | 2012-222333 A | 11/2012 |
| JP | 2012217322 A | 11/2012 |
| JP | 2013089877 A | 5/2013 |
| JP | 2013115137 A | 6/2013 |
| JP | 2013138120 A | 7/2013 |

* cited by examiner

STACKED COOLER

CROSS REFERENCE TO RELATED APPLICATIONS

This application is a continuation Application of U.S. patent application Ser. No. 14/914,580 filed on Feb. 25, 2016 which is a U.S. National Phase Application under 35 U.S.C. 371 of International Application No. PCT/JP2014/004442 filed on Aug. 28, 2014 and published in Japanese as WO 2015/029446 A1 on Mar. 5, 2015 which is based on and claims the benefit of priority from Japanese Patent Application No. 2013-178800 filed on Aug. 30, 2013, and Japanese Patent Application No. 2013-244981 filed on Nov. 27, 2013. The entire disclosures of all of the above applications are incorporated herein by reference.

TECHNICAL FIELD

The present disclosure relates to a stacked cooler in which flow pipes and heat exchange objects are alternately stacked, the flow pipes having a heat medium circulated therein.

BACKGROUND ART

A power converter such as a DC-DC converter is used for hybrid cars and electric vehicles. The power converter is provided with a cooler including a semiconductor module in which a semiconductor element such as a switching element is built and a heat exchange part to cool the semiconductor module. As the cooler used for the power converter, for example, a cooler shown in a patent document 1 can be given.

In the patent document 1 a power converter is disclosed which is provided with a cooler having a heat exchange part constituted of a plurality of cooling pipes. In the heat exchange part, a plurality of semiconductor modules and a plurality of cooling pipes are alternately stacked, so the heat exchange part is constituted in such a way that the semiconductor modules can exchange heat with a refrigerant flowing in refrigerant passages formed in the cooling pipes and hence can be cooled by the refrigerant.

PRIOR ART DOCUMENT

Patent Document

Patent Document 1: JP 2011-228580A

However, the cooler disclosed in the patent document 1 has the following problem. The power converter is requested to reduce its size and is requested to reduce the size of the heat exchange part that occupies most part of a volume also in the cooler. In order to reduce the size of the heat exchange part, a connection part of a front end cooling pipe, which is arranged at one end in a stacking direction in the heat exchange part, and a refrigerant introduction pipe and a refrigerant discharge pipe, which are connected to the front end cooling pipe and circulate the refrigerant in the refrigerant passage, needs to be reduced in size. In this case, when an external force is applied to the refrigerant introduction pipe and the refrigerant discharge pipe, a stress is easily concentrated at the connection part. For this reason, the stress in the front end cooling pipe is apt to be increased and hence to be easily deformed.

There has been known a stacked cooler in which flow pipes, each of which has a heat transfer medium circulated therein, and electronic parts, each of which constitutes a heat exchange object, are alternately stacked and which makes the heat transfer medium exchange heat with the electronic parts to thereby cool the electronic parts (for example, see patent document 1). In this regard, each of the adjacent flow pipes is provided with a protruding pipe part to protrude in the stacking direction and the protruding pipe parts of the respective flow pipes are joined to each other, whereby the respective flow pipes communicate with each other.

The patent document 1 proposes a technique for restraining the inner fin from being shifted in position in the flow pipe in the stacked cooler having an inner fin (wavy fin) provided in the flow pipe so as to accelerate a heat exchange between the heat transfer medium and the electronic part.

By the way, the stacked cooler of this type is formed in a structure in which, in order to bring the electronic part into close contact with the flow pipe, a compressive load is applied to the flow pipe in the stacking direction in a state in which the electronic part is arranged in a space formed between the flow pipes to thereby sandwich the electronic part by both surfaces of the flow pipes. At this time, the flow pipe has a root part of the protruding pipe part deformed inward by a pressing force, whereby the electronic part is brought into close contact with the flow pipe.

Here, FIG. 26 is a top view of a flow pipe 80 used in the related art. As shown in FIG. 26, the flow pipe 80 has a peripheral edge part in a longitudinal direction thereof formed in a shape of an arc and has a protruding pipe part 81 provided at a position separated by a specified distance from the peripheral edge part. Specifically, the flow pipe 80 is provided with the protruding pipe part 81 in such a way that a center of the arc of the peripheral edge part in the longitudinal direction is identical with a center of a section of the protruding pipe part 81. In this regard, a flat plane extended between the pair of protruding pipe parts 81 in the flow pipe 80 becomes a heat exchange region 82 in which the heat transfer medium exchanges heat with the electronic part.

In the flow pipe 80 of this structure, a region surrounding the root part of the protruding pipe part 81 becomes a region to receive the compressive load in the stacking direction. Of the region surrounding the root part of the protruding pipe part 81, a semicircular region 83 in which a distance from the peripheral edge part in the longitudinal direction of the flow pipe 80 to the protruding pipe part 81 is short has a strongest load applied thereto when the root part of the protruding pipe part 81 is deformed by the compressive load in the stacking direction. In addition, when a load is applied to the semicircular region 83 from many directions by vibrations or the like, the semicircular region 83 tends to cause a fatigue failure.

In contrast to this, the present inventors have conducted an earnest investigation so as to improve the durability of the flow pipe 80. As the result, the present inventors have invented a structure in which, as shown in FIG. 27, a distance from a peripheral edge part in a longitudinal direction in a flow pipe 90 to a protruding pipe part 91 is elongated to thereby expand a region to receive a compressive load in the stacking direction, whereby the durability of the flow pipe 91 is improved.

However, when the flow pipe shown in FIG. 27 is employed, a heat exchange region 92 in which the heat transfer medium exchanges heat with the electronic part is made narrow. In other words, in a case in which the flow pipe 90 shown in FIG. 27 is employed, when a heat exchange region 92 equivalent to the heat exchange region 82 of the flow pipe 80 is ensured, the size in a longitudinal direction of the flow pipe 90 needs to be enlarged.

SUMMARY OF INVENTION

The present disclosure addresses the above background art. Thus, it is an objective of the present disclosure to provide a stacked cooler that, when an external force is applied to a refrigerant introduction pipe and a refrigerant discharge pipe, can be restrained from being deformed and can be reduced in size. Further, it is another objective of the present disclosure to provide a stacked cooler capable of ensuring a heat exchange region in which a heat exchange object exchanges heat with a heat medium and of improving the durability of a flow pipe without being enlarged in size in a longitudinal direction of the flow pipe.

A stacked cooler of a first aspect of the present disclosure includes flow pipes that are stacked, each of the flow pipes having a flat shape and including a medium passage in which a heat medium flows, a heat exchange object that is disposed between each adjacent two of the flow pipes and is clamped between their flat planes, a protruding pipe part that is connected to at least one of the flow pipes and protrudes in a stacking direction of the flow pipes, and a load restraining part that restrains a load applied to a connection portion of the at least one of the flow pipes to the protruding pipe part as compared with a load applied to the other portion of the at least one of the flow pipes.

A second aspect of the present disclosure is a stacked cooler characterized by including: a heat exchange part that has a plurality of cooling pipes arranged in a stacking manner in such a way that the adjacent cooling pipes are coupled to each other and that an arrangement space used for arranging a heating part is formed between the adjacent flow pipes, the cooling pipe having a refrigerant passage to circulate a refrigerant; a refrigerant introduction pipe to introduce the refrigerant into the refrigerant passage; and a refrigerant discharge pipe to discharge the refrigerant from the refrigerant passage, wherein the refrigerant introduction pipe and the refrigerant discharge pipe are extended in a stacking direction of the plurality of cooling pipes from a front end cooling pipe arranged at a front end, which is one end in the stacking direction of the plurality of cooling pipes, and are respectively provided with a rigidity improving part to improve the rigidity of the front cooling pipe.

The stacked cooler is provided with the rigidity improving part to improve the rigidity of the front end cooling pipe. For this reason, when an external force is applied to the refrigerant introduction pipe and the refrigerant discharge pipe, it is possible to restrain the front end cooling pipe from being deformed. In this way, when a connection part of the front end cooling pipe and the refrigerant introduction pipe and a connection part of the front end cooling pipe and the refrigerant discharge pipe are reduced in size in order to reduce the size of the heat exchange part, it is possible to restrain the front end cooling pipe from being deformed. In this way, when the external force is applied to the refrigerant introduction pipe and the refrigerant discharge pipe, it is possible to restrain the front end cooling pipe from being deformed and to reduce the size of the stacked cooler.

As described above, according to the stacked cooler described above, when the external force is applied to the refrigerant introduction pipe and the refrigerant discharge pipe, it is possible to restrain the front end cooling pipe from being deformed and to reduce the size of the stacked cooler.

The stacked cooler of the present disclosure is provided with a plurality of flow pipes each of which is provided with a refrigerant passage having a heat medium circulated therein and is formed in a flat shape, and a heat exchange object that is arranged in a space formed between the adjacent flow pipes and that exchanges heat with the heat medium.

To achieve the objective, in a third aspect, the heat exchange object is disposed between each adjacent two of the flow pipes in a stacking manner such that the heat exchange object is clamped between the flat planes of the each adjacent two of the flow pipes extending in their longitudinal direction. Each of the flow pipes includes the protruding pipe part having a cylindrical shape that opens in the stacking direction and protrudes in the stacking direction, and the deforming portion that forms a root part of the protruding pipe part and is deformed by a compressive load applied in the stacking direction. A shortest distance from a peripheral edge part of the flow pipe in its short direction to the protruding pipe part is longer than a shortest distance from a peripheral edge part of the flow pipe in its longitudinal direction to the protruding pipe part.

According to this aspect, a region from a peripheral edge part in the short direction in the flow pipe to the protruding pipe part, that is, a region to receive the compressive load applied in the stacking direction can be expanded. At this time, a region from the peripheral edge part in the longitudinal direction in the flow pipe to the protruding pipe part does not need to be expanded, so it is possible to ensure a flat plane extended in the longitudinal direction in the flow pipe, that is, a heat exchange region in which the heat exchange object exchanges heat with the heat medium.

Hence, according this aspect, without expanding the size of the stacked cooler in the longitudinal direction in the flow pipe, it is possible to ensure the heat exchange region in which the heat exchange object exchanges heat with the heat medium and to improve the durability of the flow pipe.

In a fourth aspect, the flow pipe includes a pair of peripheral edge parts extending its longitudinal direction. A shortest distance from a center of a section of the protruding pipe part in a direction perpendicular to the stacking direction to the peripheral edge part of the flow pipe in its longitudinal direction is shorter than a half of a length of each of the pair of peripheral edge parts in its short direction.

According to this aspect, the protruding pipe part is made eccentric in such a way that a center of its section comes near to a peripheral edge part side in the longitudinal direction, so it is possible to sufficiently ensure a flat plane (heat exchange region) extended in the longitudinal direction in the flow pipe.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
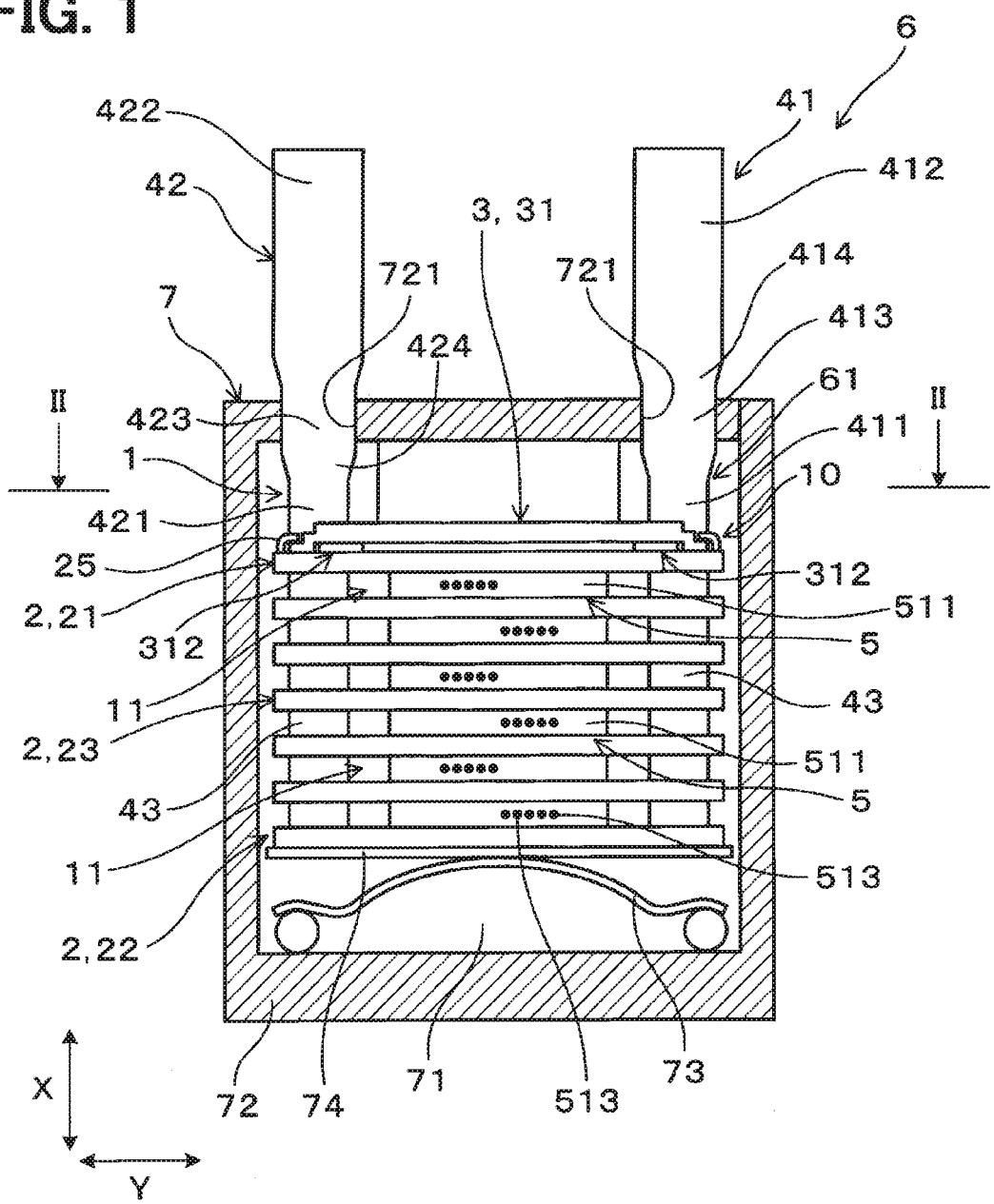
FIG. 1 is a diagram to illustrate a power converter having a stacked cooler in a first embodiment.

Hereinafter, embodiments will be described with reference to the drawings. In this regard, in the respective embodiments described below, there is a case in which a part equal or equivalent to a matter described in a preceding embodiment is denoted by a same reference character and in which its description is omitted. Further, in the respective embodiments, in a case in which only a part of a constituent element is described, a constituent element described in a preceding embodiment can be applied to the other part of the constituent element.

In a stacked cooler, a heat exchange part has a front end cooling pipe, a rear end cooling pipe arranged at a rear end in a stacking direction, and a middle cooling pipe interposed between the front end cooling pipe and the rear end cooling pipe, and the rigidity of the front end cooling pipe may be larger than the rigidity of the middle cooling pipe. In this case, it is possible to restrain an increase in the weight and in the material cost of the middle cooling pipe. In this way, it is possible to reduce the weight and the cost of the stacked cooler and at the same time to surely restrain the stacked cooler from being deformed.

Further, the rigidity of the front end cooling pipe may be larger than the rigidity of the rear end cooling pipe. In this case, by making the rigidity of the front end cooling pipe largest among the plurality of cooling pipes, it is possible to restrain an increase in the weight and in the material cost of the middle cooling pipe and the rear end cooling pipe. In this way, it is possible to reduce the weight and the cost of the stacked cooler and at the same time to surely restrain the stacked cooler from being deformed.

Still further, a rigidity improving part is made of a reinforcing plate overlaid on the front end cooling pipe, and the reinforcing plate may has a join part joined to a periphery of a connection part of a refrigerant introduction pipe and a refrigerant discharge pipe in the front end cooling pipe. In this case, the rigidity of the front end cooling pipe can be surely and easily improved by using the reinforcing plate. In this way, it is possible to surely restrain the front end cooling pipe from being deformed.

First Embodiment

Figure 2:
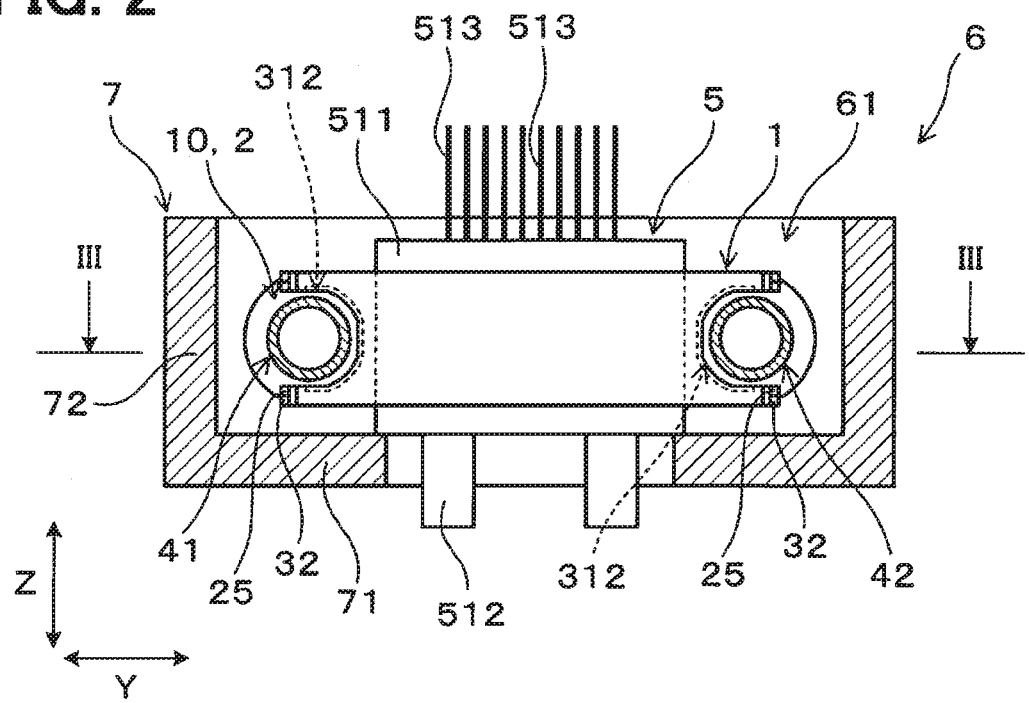
FIG. 2 is a section view when viewed from arrows II-II in FIG. 1.
Figure 3:
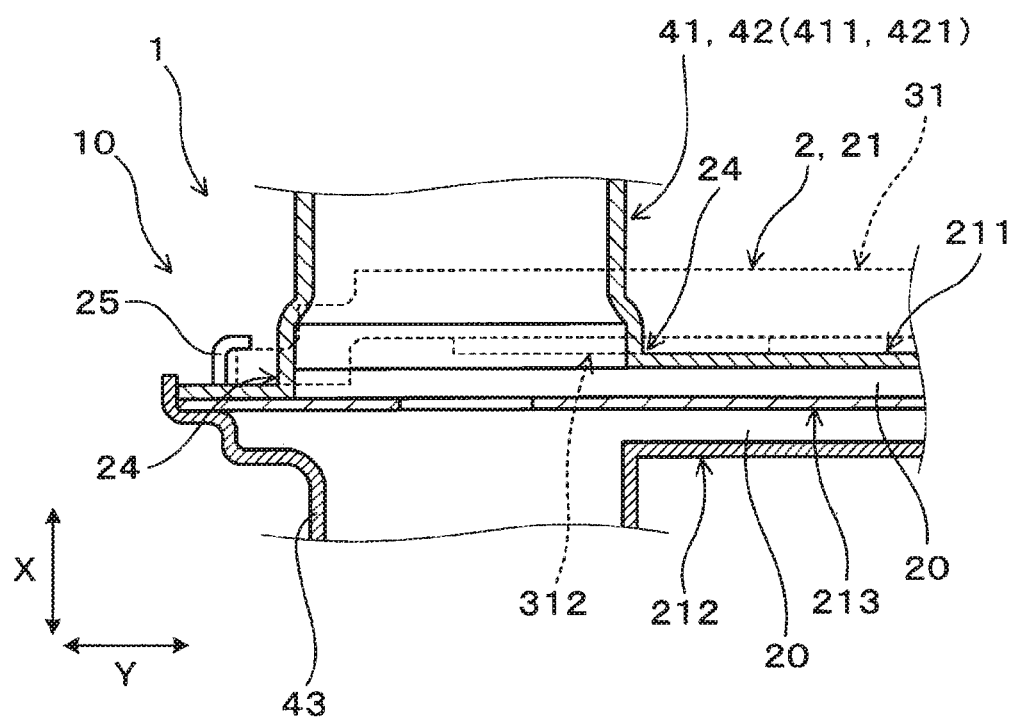
FIG. 3 is a partial section view of the stacked cooler in the first embodiment (corresponding to section, when viewed from a direction shown by arrows III-III in FIG. 2)

An embodiment relating to the stacked cooler will be described with reference to FIG. 1 to FIG. 5. As shown in FIG. 1 to FIG. 3, a stacked cooler 1 is provided with a heat exchange part 10 in which a plurality of cooling pipes (flow pipes) 2 are arranged in a stacking manner, a refrigerant introduction pipe 41 which introduces a refrigerant (heat medium) into a refrigerant passage (medium passage) 20, and a refrigerant discharge pipe 42 which discharges the refrigerant from the refrigerant passage 20. The plurality of cooling pipes 2, each of which has the refrigerant passage 20 to circulate the refrigerant, are arranged in a stacking manner in such a way that the adjacent cooling pipes 2 are coupled to each other and that an arrangement space 11 used for arranging a semiconductor module 5 as a heating part (heat exchange object) is formed between the adjacent cooling pipes 2.

The refrigerant introduction pipe 41 and the refrigerant discharge pipe 42 are extended in a stacking direction X from a front end cooling pipe 21 arranged at a front end, which is one end in the stacking direction X of the plurality of cooling pipes 2, of the plurality of cooling pipes 2. The stacked cooler 1 has a rigidity improving part 3 to improve the rigidity of the front end cooling pipe 21.

The stacked cooler 1 will be described below in more detail. As shown in FIG. 1 and FIG. 2, in the present embodiment, the stacked cooler 1 will be described on the assumption that: a direction in which the cooling pipes 2 of the stacked cooler 1 are stacked is the stacking direction X; a longitudinal direction in the cooling pipe 2 is a lateral direction Y; and a direction orthogonal to both of the stacking direction X and the lateral direction Y is an up and down direction Z. In the stacking direction X, a direction in which the refrigerant introduction pipe 41 and the refrigerant discharge pipe 42 are protruded is assumed to be a front side and a direction opposite to the front side is assumed to be a rear side. Further, in the up and down direction Z, a side in which a main electrode terminal 512 of the semiconductor module 5 is protruded is assumed to be a lower side and a side opposite to the down side is assumed to be an upper side. In this regard, the stacking direction X, the lateral direction Y, and the up and down direction Z are determined for the purpose of convenience and the directions of the stacked cooler 1 are not necessarily limited to these directions.

As shown in FIG. 1 and FIG. 2, the stacked cooler 1 of the present embodiment is used for cooling a plurality of semiconductor modules 5 in a power converter 6. The power converter 6 has a semiconductor unit 61, which is made of the stacked cooler 1 and the plurality of semiconductor modules 5, and a case 7 which receives the semiconductor unit 61.

As shown in FIG. 1 and FIG. 2, the case 7 which receives the semiconductor unit 61 has a bottom part 71 arranged below and a wall part 72 erected upward from an outer peripheral edge of the bottom part 71. The bottom part 71 is formed in a rectangular shape larger than an outward form of the semiconductor unit 61 when viewed from above.

The wall part 72 is formed in the shape of a square cylinder erected upward from the whole circumference of the outer peripheral edge of the bottom part 71. Further, in the wall part 72 arranged on the front side a pair of through holes 721 is formed in such a way that the refrigerant introduction pipe 41 and the refrigerant discharge pipe 42 are passed through the through holes.

As shown in FIG. 1 and FIG. 2, the plurality of semiconductor modules 5 which constitute the semiconductor unit 61 has a main part 511 having a switching element, a plurality of control terminals 513 extending upward from the main part 511, and a plurality of main electrode terminals 512 extending downward from the main part 511.

The semiconductor module 5 has a switching element such as an IGBT (Insulated Gate Bipolar Transistor) or a MOFET (MOS type field effect transistor) built therein. The main part 511 in the semiconductor module 5 of the present embodiment is formed in the shape of a flat plate and is formed by molding one switching element with resin. The control terminals 513 formed so as to extend upward from the main part 511 are connected to a control circuit board (not shown in the drawing) and have a control current inputted therein, the control current controlling the switching element.

As shown in FIG. 1 to FIG. 3, the stacked cooler 1 to cool the plurality of semiconductor modules 5 has a heat exchange part 10 in which the plurality of cooling pipes are arranged in a stacking manner, the refrigerant introduction pipe 41 to introduce the refrigerant into the refrigerant passage 20, and the refrigerant discharge pipe 42 to discharge the refrigerant from the refrigerant passage 20.

The plurality of cooling pipes 2, which constitute the heat exchange part 10 and each of which has the refrigerant passage 20 to circulate the refrigerant, are arranged in the stacking manner in such a way that the adjacent cooling pipes 2 are coupled to each other and that the arrangement space 11 used for arranging the semiconductor module 5 is formed between the adjacent cooling pipes 2. The plurality of cooling pipes 2 include the front end cooling pipe 21 arranged at an end on a front side in the heat exchange part 10, a rear end cooling pipe 22 arranged at an end on a rear side, and the middle cooling pipes 23 arranged between the front end cooling pipe 21 and the rear end cooling pipe 22.

In the present embodiment, the cooling pipe 2 has a front outer shell plate 211 arranged on the front side, a rear outer shell plate 212 arranged on the rear side, and a middle plate 213 arranged between the front outer shell plate 211 and the rear outer shell plate 212.

When the front outer shell plate 211 is joined to the rear outer shell plate 212, a space to form the refrigerant passage 20 is formed between them, and the refrigerant passage 20 is divided into two parts in a front and rear direction by the middle plate 213. The plurality of cooling pipes 2 are arranged in such a way as to sandwich the semiconductor module 5 from both faces. The adjacent cooling pipes 2 are coupled to each other by coupling pipes 43 near both end parts in the lateral direction Y.

As shown in FIG. 1 to FIG. 3, the refrigerant introduction pipe 41 and the refrigerant discharge pipe 42 are extended forward with the front end cooling pipe 21 used as a base end. Further, the refrigerant introduction pipe 41 and the refrigerant discharge pipe 42 are extended in a stacking direction X respectively from base end side pipe parts 411, 412 with its diameter expanded in two stages, whereby tip end parts arranged on the front side constitute tip end side pipe parts 412, 422, respectively. In other words, between the base end side pipe part 411 and the tip end side pipe part 412, a middle pipe part 413 is formed, the middle pipe part 413 having an outside diameter of a middle of diameters of the base end side pipe part 411 and the tip end side pipe part 412, whereas between the base end side pipe part 412 and the tip end side pipe part 422, a middle pipe part 423 is formed, the middle pipe part 423 having an outside diameter of a middle of diameters of the base end side pipe part 412 and the tip end side pipe part 422. Hence, a tapered stepped part 414-1 is formed at a boundary portion between the base end side pipe part 411 and the middle pipe part 413 and a tapered stepped part 414-2 is formed at a boundary portion between the middle pipe part 413 and the tip end side pipe part 412, whereas a tapered stepped part 424-1 is formed at a boundary portion between the base end side pipe part 421 and the middle pipe part 423 and a tapered stepped part 424-2 is formed at a boundary portion between the middle pipe part 423 and the tip end side pipe part 422.

In the present embodiment, in the refrigerant introduction pipe 41 and the refrigerant discharge pipe 42, portions on the base end side of the base end side pipe parts 411, 421 are formed along with the front shell plate 211 of the front end cooling pipe 21 by a press forming, and other portions closer to the tip end side are formed of separate members and then are joined to the portions on the base end side, respectively. The refrigerant introduction pipe 41 and the refrigerant discharge pipe 42 are arranged nearly coaxially with the coupling pipes 43, respectively, near the both end parts in the lateral direction Y and are passed through the pair of through holes 721 formed in the wall part 72 arranged forward of the case 7, respectively.

In the stacked cooler 1, the refrigerant introduced from the refrigerant introduction pipe 41 is passed through the coupling pipe 43 as appropriate and is distributed into the respective cooling pipes 2 and is circulated in the longitudinal direction (lateral direction Y). Then, the refrigerant exchanges heat with the semiconductor module 5 while the refrigerant flows in the cooling pipes 2. The refrigerant having its temperature increased by the heat exchange flows through the coupling pipe 43 on a downstream side and is guided to and discharged from the refrigerant discharge pipe 42. As the refrigerant can be used, for example, a natural refrigerant such as water or ammonia, water mixed with an ethylene glycol based antifreeze, a carbon fluoride based refrigerant such as Fluorinert, a fluorocarbon based refrigerant such as HCFC123 or HFC134a, an alcohol based refrigerant such as methanol or alcohol, and a ketone based refrigerant such as acetone.

As shown in FIG. 1 to FIG. 3, the front end cooling pipe 21 in the stacked cooler 1 is provided with a reinforcing plate 31 as a rigidity improving part 3, which improves the rigidity of the front end cooling pipe 21, and an engaging claw 25, which temporarily holds the reinforcing plate 31. The reinforcing plate 31 is formed of a nearly rectangular flat plate and is joined to a front surface of the front end cooling pipe 21 in a join part 312 in such a way that its longitudinal direction is the lateral direction Y and that its normal direction is the stacking direction X.

Figure 4:
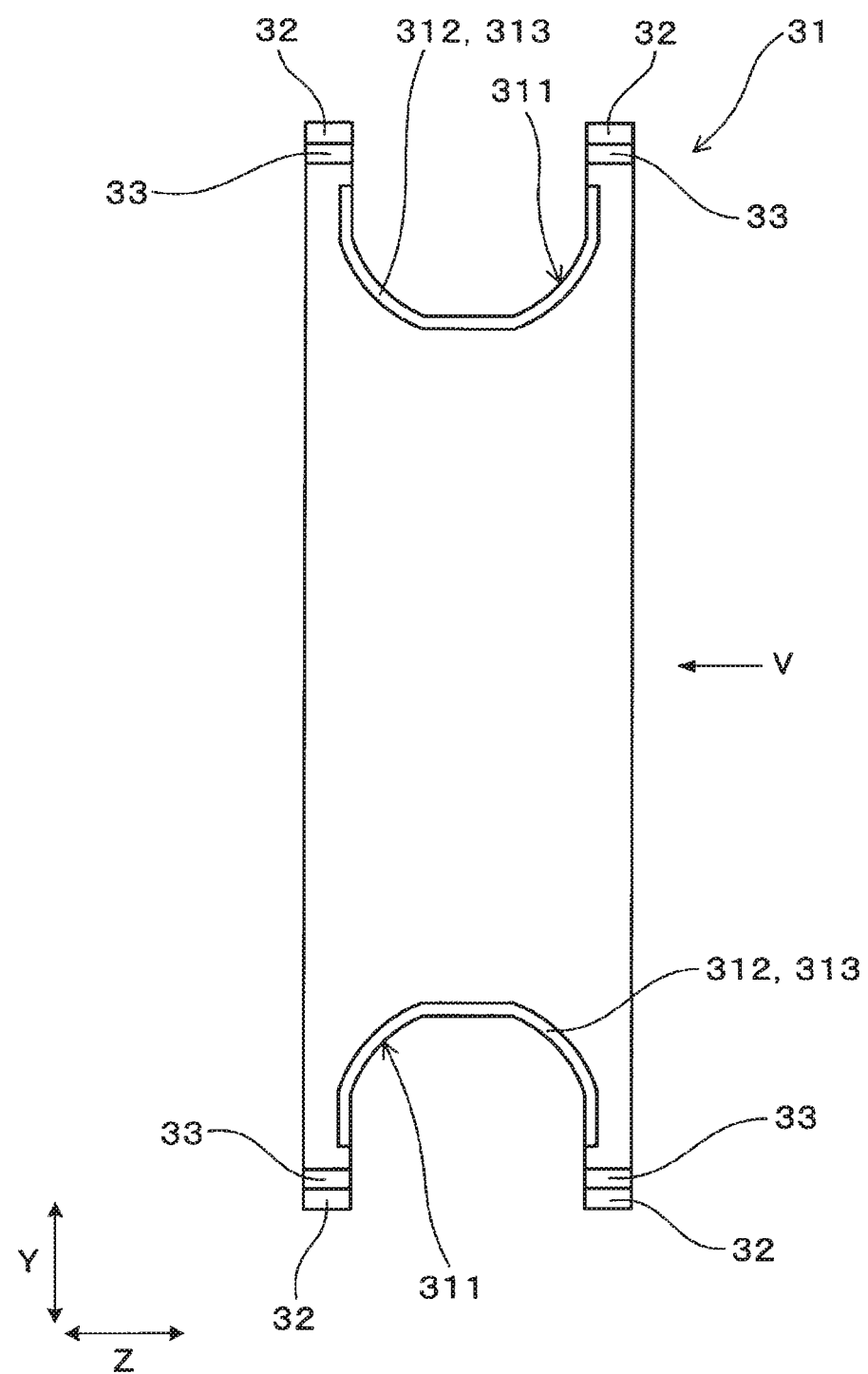
FIG. 4 is a diagram to illustrate a reinforcing plate in the first embodiment.
Figure 5:
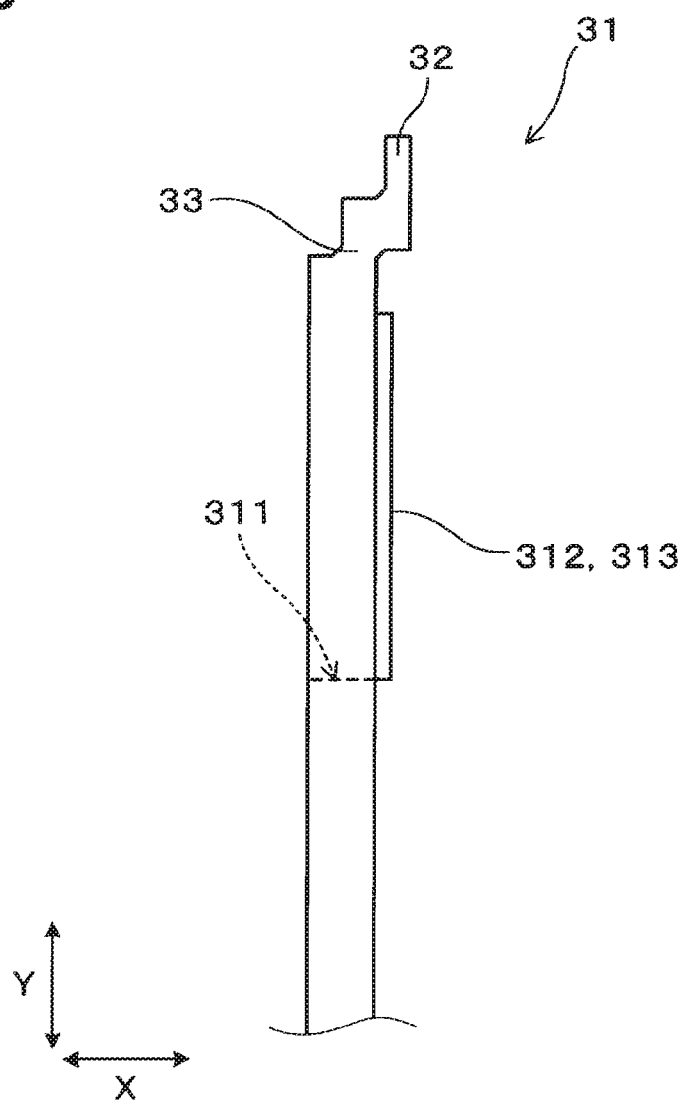
FIG. 5 is a view when viewed from a direction shown by an arrow V in FIG. 4.

As shown in FIG. 4 and FIG. 5, each of both end parts in the lateral direction Y of the reinforcing plate 31 has a plate end depressed part 311, which is formed so as to be depressed inside in the lateral direction Y and hence is nearly shaped like a letter U, and has the refrigerant introduction pipe 41 and the refrigerant discharge pipe 42 arranged inside the plate end depressed part 311 (see FIG. 2). Further, the width in the up and down direction in the reinforcing plate 31 is set at the same as the width of the front end cooling pipe 21.

The reinforcing plate 31 has two join parts 312. One of the two join parts 312 is joined to the periphery of the connection part 24 of the front end cooling pipe 21 and the refrigerant introduction pipe 41, and the other of the two join parts 312 is joined to the periphery of the connection part 24 of the front end cooling pipe 21 and the refrigerant discharge pipe 42. Each of the join parts 312 is formed along an inner peripheral edge in the plate end depressed part 311. In the present embodiment, each of the join parts 312 is formed in the shape of a letter C along a nearly semicircular periphery on a central side of the lateral direction Y of the front end cooling pipe 21 in the periphery of the connection part 24 (see FIG. 3). The whole surface of the join part 312 forms a protruding part 313 protruding toward the front end cooling pipe 21. In the present embodiment, the whole surface of the join part 312 forms the protruding part 313 but a portion of the join part 312 may form the protruding part 313.

The reinforcing plate 31 has a pair of engaged parts 32 formed respectively on both ends in the lateral direction Y, the engaged part 32 being engaged by an engaging claw 25. The engaged part 32 is formed in such a way as to extend along the surface of the front end cooling pipe 21 at a position corresponding to the engaging claw 25 of the front end cooling pipe 21 and to protrude outward in the lateral direction Y from the reinforcing plate 31. Further, as shown in FIG. 5, a thin part 33 is formed between the join part 312 and the engaged part 32 in the reinforcing plate 31. In the stacking direction X, the thickness of the thin part 33 is set smaller than the thickness of the join part 312.

In a stage before the front end cooling pipe 21 and the reinforcing plate 31 being joined to each other, the temporarily held reinforcing plate 31 is joined to the front surface of the front end cooling pipe 21 by brazing. In this way, by joining the reinforcing plate 31 to the front end cooling pipe 21, the rigidity of the front end cooling pipe 21 is made larger than the rigidity of the rear end cooling pipe 22 and the rigidity of the middle cooling pipe 23.

As shown in FIG. 1, the semiconductor unit 61, which is formed of the stacked cooler 1 and the plurality of semiconductor modules 5, is pressed by a spring member 73, which biases the semiconductor unit 61 in the stacking direction X, from a side opposite to a side in which the refrigerant introduction pipe 41 and the refrigerant discharge pipe 42 are connected to the semiconductor unit 61. An abutting plate 74, which restrains the rear end cooling pipe 22 from being deformed, is arranged between the spring member 73 and the rear end cooling pipe 22.

The operation and effect of the present embodiment will be described below. The stacked cooler 1 has the rigidity improving part 3 to improve the rigidity of the front end cooling pipe 21. For this reason, when an external force is applied to the refrigerant introduction pipe 41 and the refrigerant discharge pipe 42, it is possible to prevent the front end cooling pipe 21 from being deformed. In this way, even when the connection part 24 of the refrigerant introduction pipe 41 and the front end cooling pipe 21 and the connection part 24 of the refrigerant discharge pipe 42 and the front end cooling pipe 21 have their diameters reduced in order to reduce the size of the heat exchange part 10, it is possible to prevent the front end cooling pipe 21 from being deformed. In this way, when the external force is applied to the refrigerant introduction pipe 41 and the refrigerant discharge pipe 42, it is possible to restrain the front end cooling pipe 21 from being deformed and at the same time to reduce the size of the stacked cooler 1.

Further, the heat exchange part 10 has the front end cooling pipe 21, the rear end cooling pipe 22 arranged on the rear end in the stacking direction X, and the middle cooling pipes 23 arranged between the front end cooling pipe 21 and the rear end cooling pipe 22, and the rigidity of the front end cooling pipe 21 is larger than the rigidity of the rear end cooling pipe 22 and the rigidity of the middle cooling pipe 23. For this reason, by making the rigidity of the front end cooling pipe 21 largest among the plurality of cooling pipes 2, it is possible to restrain the middle cooling pipes 23 and the rear end cooling pipe 22 from being increased in the weight and in the material cost. In this way, it is possible to reduce the weight and the cost of the stacked cooler 1 and at the same time to surely restrain the front end cooling pipe 21 from being deformed.

Still further, the rigidity improving part 3 is made of the reinforcing plate 31 overlaid on the front end cooling pipe 21. The reinforcing plate 31 has two join parts 312. One of the two join parts 312 is joined to the periphery of the connection part 24 of the front end cooling pipe 21 and the refrigerant introduction pipe 41, and the other of the two join parts 312 is joined to the periphery of the connection part 24 of the front end cooling pipe 21 and the refrigerant discharge pipe 42. For this reason, the rigidity of the front end cooling pipe 21 can be improved surely and easily by using the reinforcing plate 31. In this way, it is possible to surely restrain the front end cooling pipe 21 from being deformed.

Still further, the reinforcing plate 31 has the protruding part 313 protruding toward the front end cooling pipe 21. For this reason, the protruding part 313 can be brought into contact with the front end cooling pipe 21. In this way, it is possible to surely join the reinforcing plate 31 to the front end cooling pipe 21 in the join part 312.

Still further, the front end cooling pipe 21 has the engaging claws 25 to hold the reinforcing plate 31 and the reinforcing plate 31 has the engaged parts 32 that can be engaged respectively by the engaging claws 25. When the engaging claws 25 engage with the engaged parts 32, the reinforcing plate 31 can be temporarily held by the front end cooling pipe 21. For this reason, a work of joining the reinforcing plate 31 to the front end cooling pipe 21 can be easily conducted. In this way, it is possible to improve the productivity of the stacked cooler 1.

Still further, the reinforcing plate 31 has the thin part 33 formed between the join part 312 and the engaged part 32, the thin part 33 being formed in a thinner thickness than the thickness of the join part 312. For this reason, when a force is applied to the engaged part 32, the thin part 33 is deformed, which can restrain the force from being transferred to the join part 312. In this way, it is possible to restrain the join part 312 from being deformed.

As described above, according to the stacked cooler 1 of the present embodiment, when the external force is applied to the refrigerant introduction pipe 41 and the refrigerant discharge pipe 42, it is possible to restrain the stacked cooler 1 from being deformed and at the same time to reduce the size of the stacked cooler 1.

In the present embodiment, the reinforcing plate 31 of one member is used. However, the present disclosure is not necessarily limited to this reinforcing plate 31 but a reinforcing plate 31, which is divided into a part on a refrigerant introduction pipe 41 side and a part on a refrigerant discharge pipe 42 side, can also be used. Further, the reinforcing plate 31, as shown in the present embodiment, may be joined to a front surface of the front end cooling pipe 21 and may be joined to a rear surface of the front end cooling pipe 21.

Second Embodiment

Figure 6:
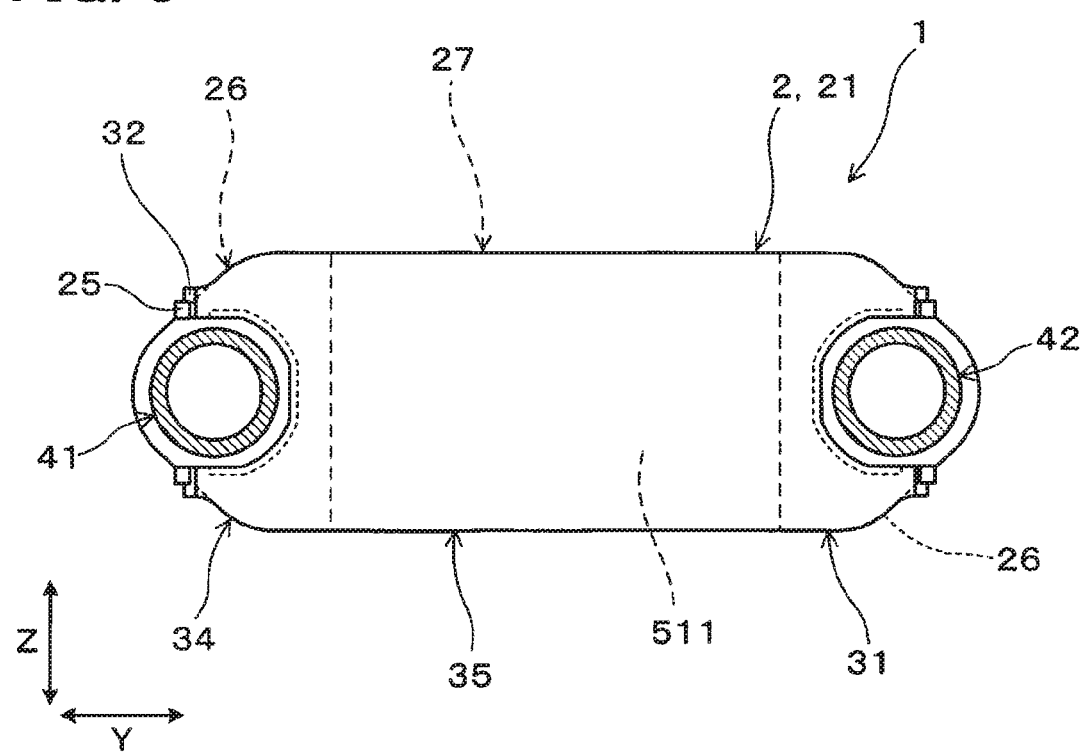
FIG. 6 is a diagram to illustrate a stacked cooler in a second embodiment.

The present embodiment, as shown in FIG. 6, is an example of a stacked cooler in which the shape of the cooling pipe is partially changed. In the stacked cooler 1 of the present embodiment a cooling pipe 2 is used in which a width in the up and down direction Z is increased.

As shown in FIG. 6, the cooling pipe 2 of the present embodiment has a pair of tapered parts 26, formed so as to be increased in width toward a central side from both end parts when viewed from the stacking direction X, and a pair of wide cooling faces 27, arranged between the pair of tapered parts 26 and sandwiching the semiconductor module 5.

The reinforcing plate 31 joined to the front end cooling pipe 21 is formed in a shape along the outward form of the cooling pipe 2. The reinforcing plate 31 has a pair of plate tapered parts 34, formed so as to be widened toward a central side from both end parts when viewed from the stacking direction X, and a pair of plate wide parts 35, formed between the pair of plate tapered parts 34. In this regard, of the reference characters used in the present embodiment or in the drawings relating to the present embodiment, the same reference characters as the reference character used in the first embodiment designate the same constituent elements as the first embodiment, unless otherwise designated.

Also in the present embodiment, the same operation and effect as the first embodiment can be produced. Further, the reinforcing plate 31 shown in the first embodiment can also be used for the cooling pipe 2 increased in width.

Third Embodiment

Figure 7:
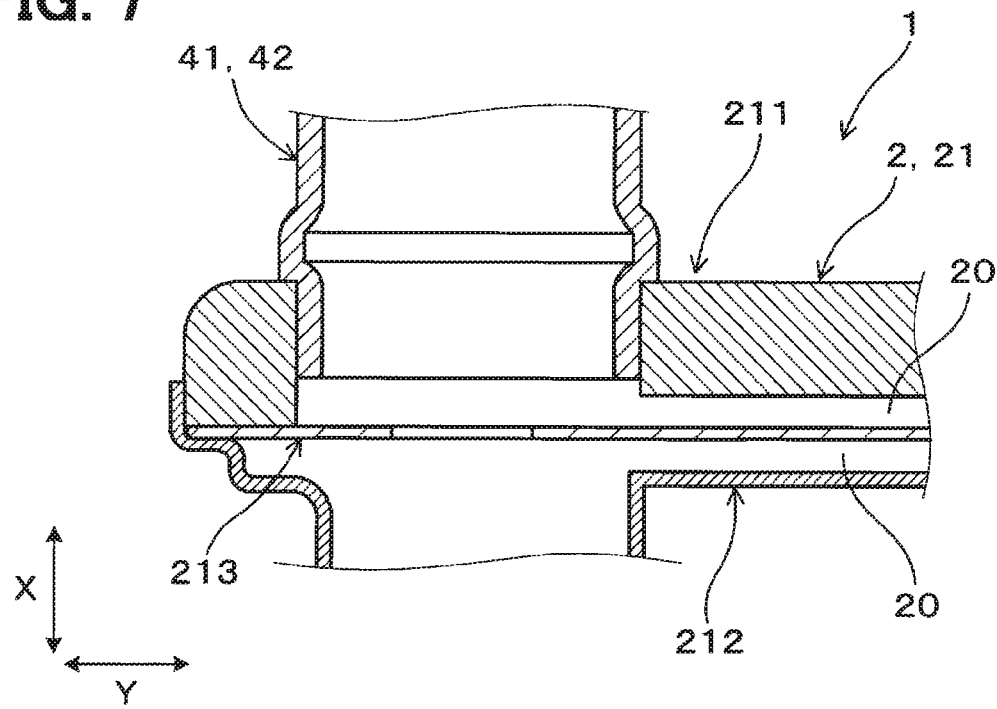
FIG. 7 is a partial section view to illustrate a stacked cooler in a third embodiment.

The present embodiment, as shown in FIG. 7, is an example of the rigidity improving part. In the stacked cooler 1 of the present embodiment, the rigidity improving part 3 has the front outer shell plate 211 of the front end cooling pipe 21 increased in thickness as compared with the thickness of the rear outer shell plate 212 and the thickness of the middle plate 213. Further, the refrigerant introduction pipe 41 and the refrigerant discharge pipe 42 are formed of a member separate from the front outer shell plate 211 and are fitted in the front outer shell plate 211 and are joined to the front outer shell plate 211 by brazing. In this regard, of the reference characters used in the present embodiment or in the drawings relating to the present embodiment, the same reference characters as the reference characters used in the first embodiment designate the same constituent elements as the first embodiment, unless otherwise designated.

Also in the present embodiment, the same operation and effect as the first embodiment can be produced. Further, in the present embodiment, the front outer shell plate 211 is increased in thickness, but the rear outer shell plate 212 may be increased in thickness.

Fourth Embodiment

Figure 8:
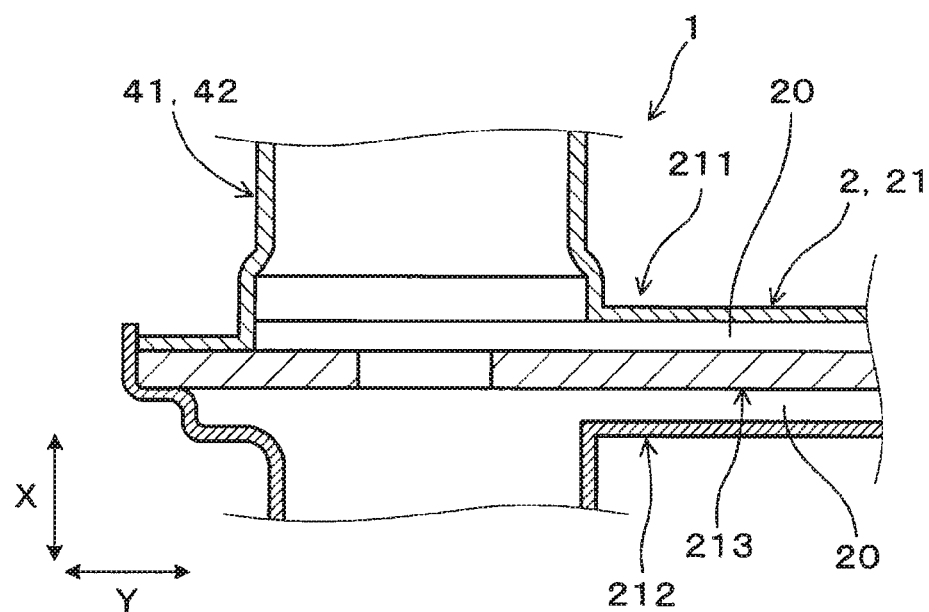
FIG. 8 is a partial section view to illustrate a stacked cooler in a fourth embodiment.

The present embodiment, as shown in FIG. 8, is another example of the rigidity improving part. As shown in FIG. 8, in the stacked cooler 1 of the present embodiment, the rigidity improving part 3 has the middle plate 213 to constitute the front end cooling pipe 21 increased in thickness as compared with the thickness of the front outer shell plate 211 and the thickness of the rear outer shell plate 212. In this regard, of the reference characters used in the present embodiment or in the drawings relating to the present embodiment, the same reference characters as the reference characters used in the first embodiment designate the same constituent elements as the first embodiment, unless otherwise designated. Also in the present embodiment, the same operation and effect as the first embodiment can be produced.

Fifth Embodiment

In the present embodiment an embodiment will be described that constitutes a cooler to cool a plurality of electronic parts 102 as "a heat exchange object" by using a stacked cooler 101.

Figure 9:
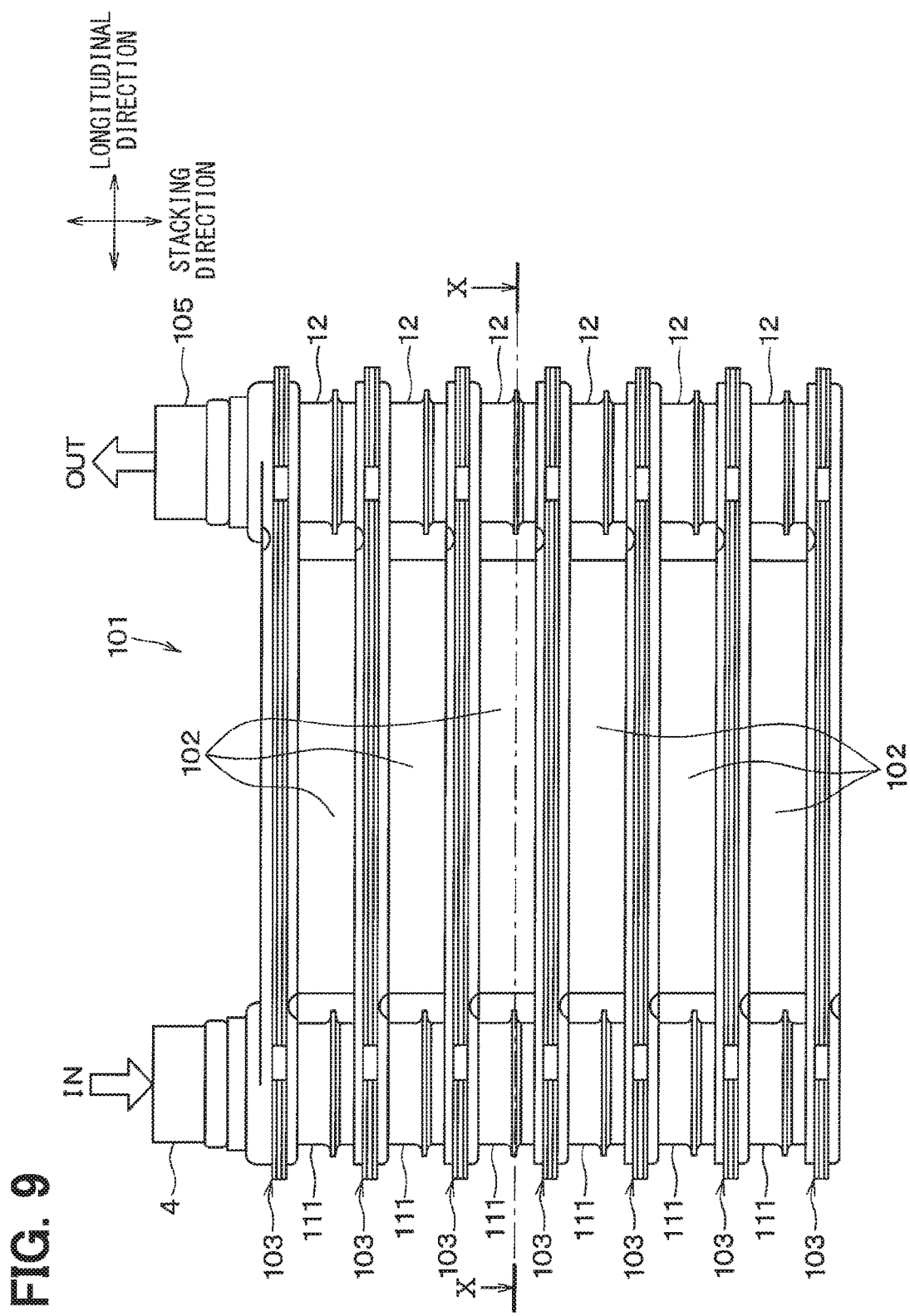
FIG. 9 is a front view of a stacked cooler according to a fifth embodiment.
Figure 10:
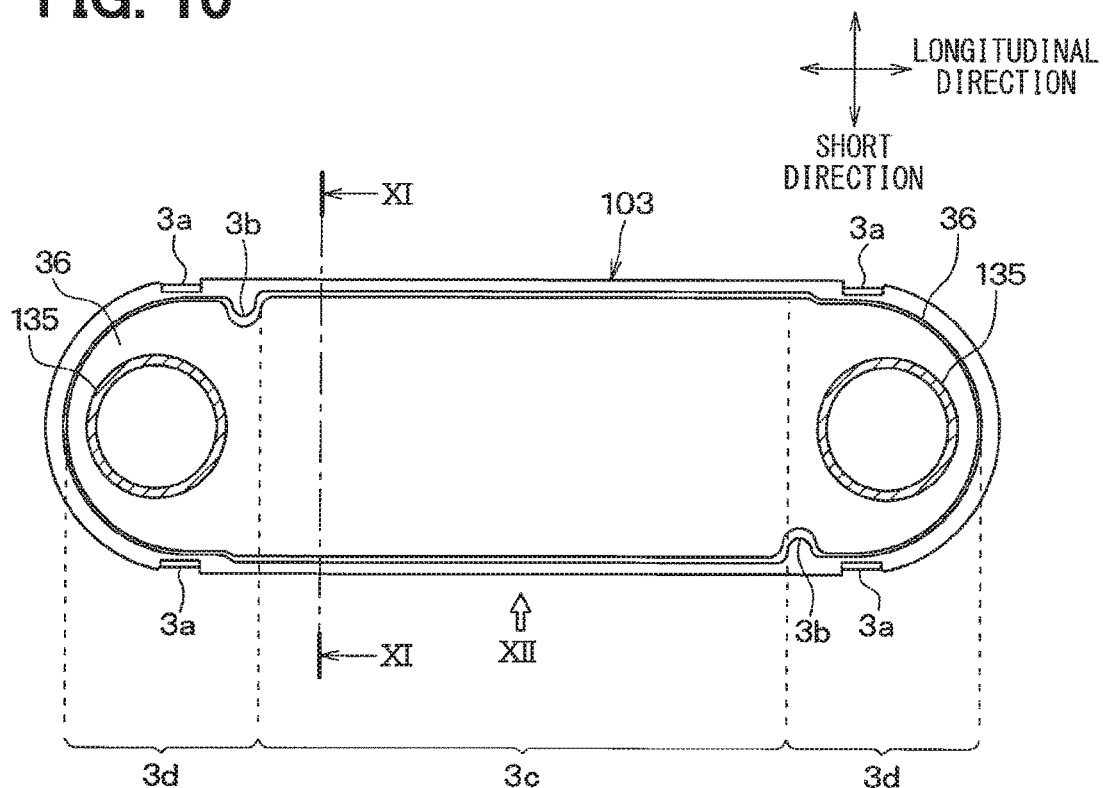
FIG. 10 is a section view taken on a line X-X in FIG. 9.

The stacked cooler 101, as shown in FIG. 9 and FIG. 10, is constituted in such a way that a plurality of flow pipes 103, each of which is formed in a flat shape, are stacked in a state in which electronic parts 102 are arranged in respective spaces formed between the adjacent flow pipes 103. In this regard, FIG. 10 is a drawing to show an X-X section view in FIG. 9 but omits the electronic part 102 so as to clarify the shape of the flow pipe 103.

The electronic part 102 is formed in a flat rectangular shape so as to have both surfaces thereof sandwiched by the adjacent flow pipes 103. In the present embodiment, as the electronic part 102, a semiconductor module (part constituted of a semiconductor element such as an IGBT and a diode) is employed, which is used for an inverter for a vehicle or a motor driven inverter used for an industrial instrument. In this regard, as the electronic part 102, for example, a power transistor or a power FET other than the semiconductor module may be employed.

In the flow pipe 103, as shown in FIG. 10, a pair of peripheral edge parts in a short direction is extended in parallel along the longitudinal direction, and a pair of peripheral edge end parts in the longitudinal direction is formed in the shape of a semicircular arc so as to form a semicircle.

Figure 11:
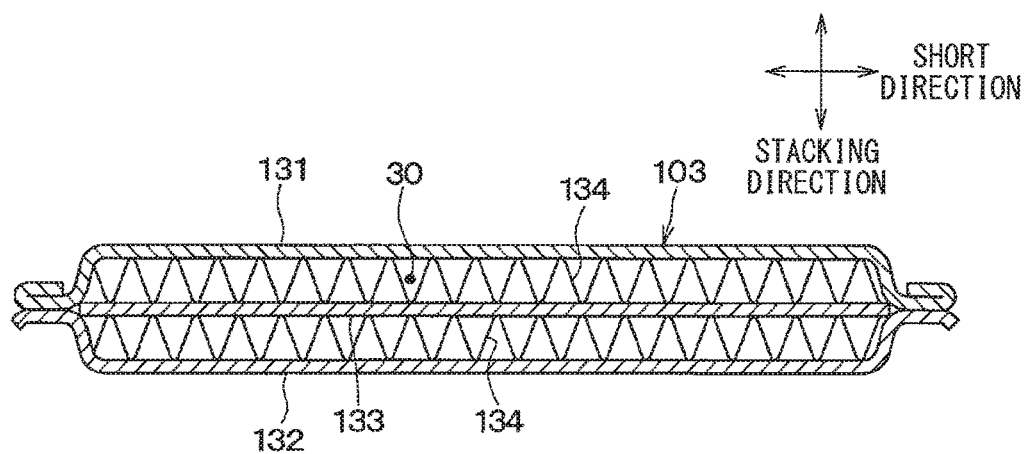
FIG. 11 is a section view taken on a line XI-XI in FIG. 10.

The flow pipe 103 of the present embodiment is constituted by stacking metal plates having a high thermal conductivity such as aluminum or copper and by joining these metal plates. Specifically, the flow pipe 103, as shown in FIG. 11, has a pair of outer shell plates 131, 132, a middle plate 133 interposed between the pair of outer shell plates 131, 132, and wavy inner fins 134 interposed between the outer shell plates 131, 132 and the middle plate 133.

Medium passages 30 in which a heat transfer medium (heat medium) flows are formed between the outer shell plates 131, 132 and the middle plate 133. In this regard, as the heat transfer medium can be used, for example, water mixed with an ethylene glycol based antifreeze, a natural refrigerant such as water or ammonia, a fluorocarbon based refrigerant such as HFC134a, an alcohol based refrigerant such as methanol or alcohol, and a ketone based refrigerant such as acetone.

The pair of outer shell plates 131, 132 is a plate member constituted of the outer shell of the flow pipe 103. The outer shell plates 131, 132 are joined to each other by a brazing material arranged on the inside of their peripheral edge parts. The brazing material arranged on the inside of the outer shell plates 131, 132 is used also for joining the middle plate 133 and the inner fins 134 to the outer shell plates 131, 132. In this regard, the peripheral edge parts in the flow pipe 103 are join portions in which the outer shell plates 131, 132 are joined to each other by the brazing material.

The flow pipe 103 of the present embodiment, as shown in FIG. 10, has claw parts 3a formed in the peripheral edge parts extended in the longitudinal direction of the flow pipe 103. The claw parts 3a constitute "reinforcing parts" to reinforce the joining of the peripheral edge parts in the pair of outer shell plates 131, 132 from the outside. The claw parts 3a of the present embodiment are formed at positions at a specified interval from a protruding pipe part 135, which will be described later, of the peripheral edge parts extended in the longitudinal direction of the flow pipe 103.

Returning to FIG. 11, the middle plate 133 is a rectangular plate member and is joined to the pair of outer shell plates 131, 132 via the inner fins 134. Although not shown in the drawing, the middle plate 133 has a circular opening formed therein in correspondence to an opening of the protruding pipe part 135, which will be described later. In this regard, the middle plate 133 may have its peripheral edge part sandwiched by the pair of outer shell plates 131, 132.

The inner fins 134 are members to accelerate heat transfer between the heat transfer medium, which is circulated in the medium passage 30, and the electronic part 102. The inner fins 134 of the present embodiment have their end parts in the longitudinal direction positioned by ribs 3b formed inward at the peripheral edge parts extended in the longitudinal direction of the flow pipe 103 shown in FIG. 10. In this regard, the ribs 3b of the present embodiment are formed at positions at a specified interval from the protruding pipe part 135, which will be described later, of the peripheral edge parts extended in the longitudinal direction of the flow pipe 103.

Figure 12:
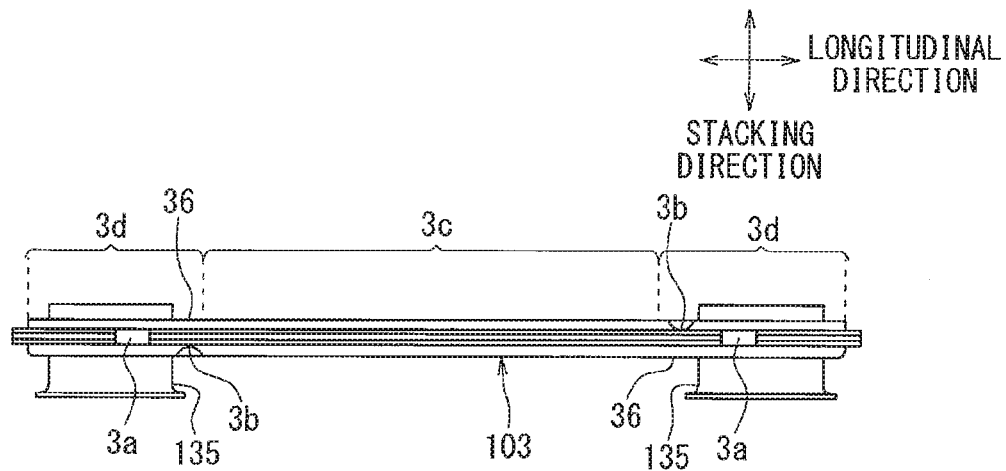
FIG. 12 is a view when viewed from a direction shown by an arrow XII in FIG. 10.

Further, on both sides in the longitudinal direction of the flow pipe 103, as shown in FIG. 12, the cylindrical protruding pipe parts 135 are provided which are open in the stacking direction and which protrude in the stacking direction. The adjacent flow pipes 103 are coupled to each other by fitting the protruding pipe parts 135 and by joining the side walls of the protruding pipe parts 135 to each other. In this regard, of the plurality of flow pipes 103, each of the flow pipes 103 other than the pair of flow pipes 103 positioned on the outermost side in the stacking direction has a pair of protruding pipe parts 135 formed on both opposite surfaces opposed to the adjacent flow pipes 103. In contrast to this, of the plurality of flow pipes 103, each of the pair of flow pipes 103 positioned on the outermost sides in the stacking direction has the protruding pipe part 135 provided only on one surface opposed to the adjacent flow pipe 103.

In the adjacent flow pipes 103, their medium passages 30 communicate with each other because their protruding pipe parts 135 are joined to each other. Of the pair of protruding pipe parts 135, one protruding pipe part 135 functions as a supply header part 111 to supply the heat transfer medium to the medium passage 30 of the respective flow pipes 103, whereas the other protruding pipe part 135 functions as a discharge header part 12 to discharge the heat transfer medium from the medium passages 30 of the respective flow pipes 103.

The flow pipe 103 can be broadly divided into a flat plane 3c, which constitutes a heat exchange region to make the heat transfer medium circulated in the medium passage 30 exchange heat with the electronic part 102, and portions 3d which constitutes the supply header part 111 and the discharge header part 12, respectively.

Each of the portions 3d which constitute the supply header part 111 and the discharge header part 12 in the flow pipe 103 is characterized by the protruding pipe part 135 and a ring-shaped diaphragm part 36 having a specified width in a root portion (near a root) of the protruding pipe part 135. The diaphragm part 36 is a portion which, when a compressive load is applied to the flow pipe 103 in the stacking direction, receives the compressive load via the protruding pipe part 135 and is deformed to the inside of the flow pipe 103.

Returning to FIG. 9, of the plurality of flow pipes 103, one of the pair of flow pipes 103 arranged on the outermost side in the stacking direction has a medium introduction part 4 and a medium discharge part 105 connected to both ends in the longitudinal direction thereof, the medium introduction part 4 introducing the heat transfer medium into the stacked cooler 101, the medium discharge part 105 discharging the heat transfer medium from the stacked cooler 101. The medium introduction part 4 and the medium discharge part 105 are joined to the one flow pipe 103 arranged on the outermost side in the stacking direction by using a joining technique such as a brazing technique.

Figure 13:
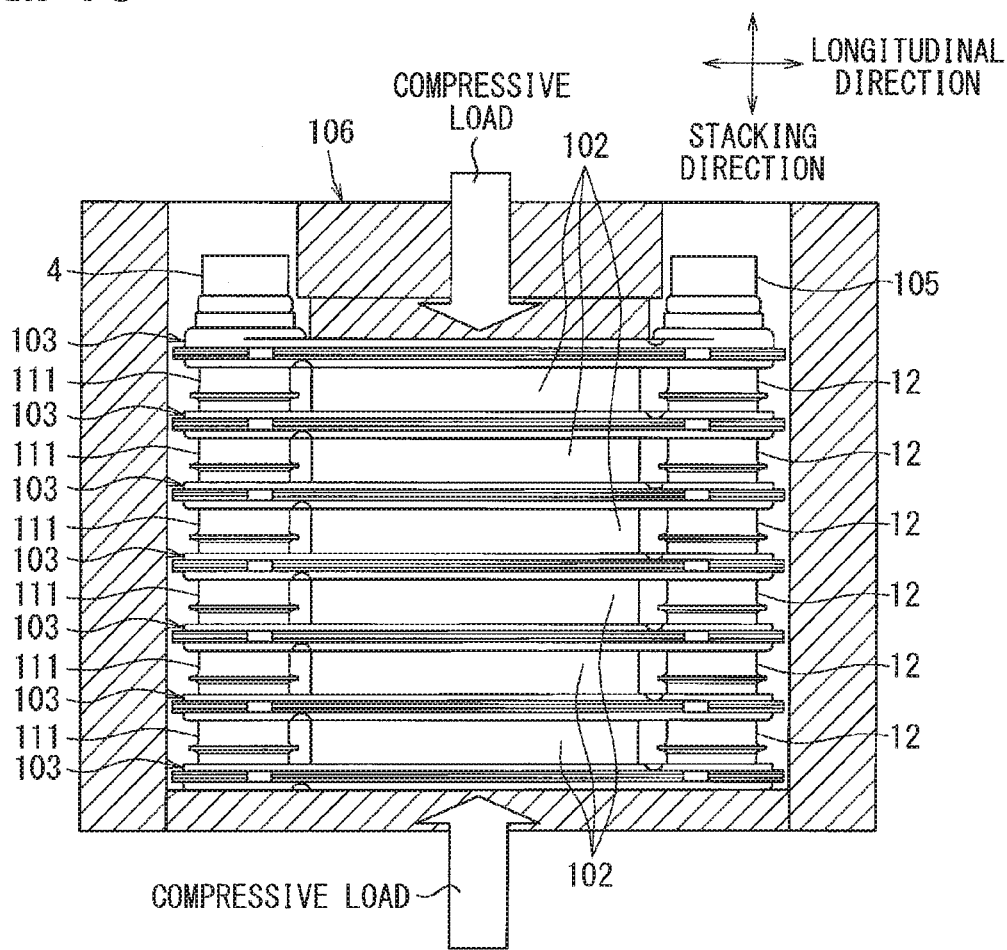
FIG. 13 is a front view of the stacked cooler according to the fifth embodiment when a compressive load is applied to the stacked cooler in a stacking direction.

Here, in order to improve the adhesion of the electronic parts 102 to the flow pipes 103, as shown in FIG. 13, the stacked cooler 101 is formed in a structure in which the electronic parts 102 and the flow pipes 103 are compressed in the stacking direction by a press machine 106 in a state in which the electric parts 102 are arranged in spaces formed between the flow pipes 103, whereby the electronic parts 102 are sandwiched by both surfaces of the flow pipes 103. At this time, the diaphragm part 36 to constitute the root part of the protruding pipe part 135 of the flow pipe 103 is deformed to the inside of the flow pipe 103 by the compressive load. In this way, the diaphragm part 36 is a portion to be deformed by the compressive load and hence needs to have a higher durability than the other portions.

Figure 14:
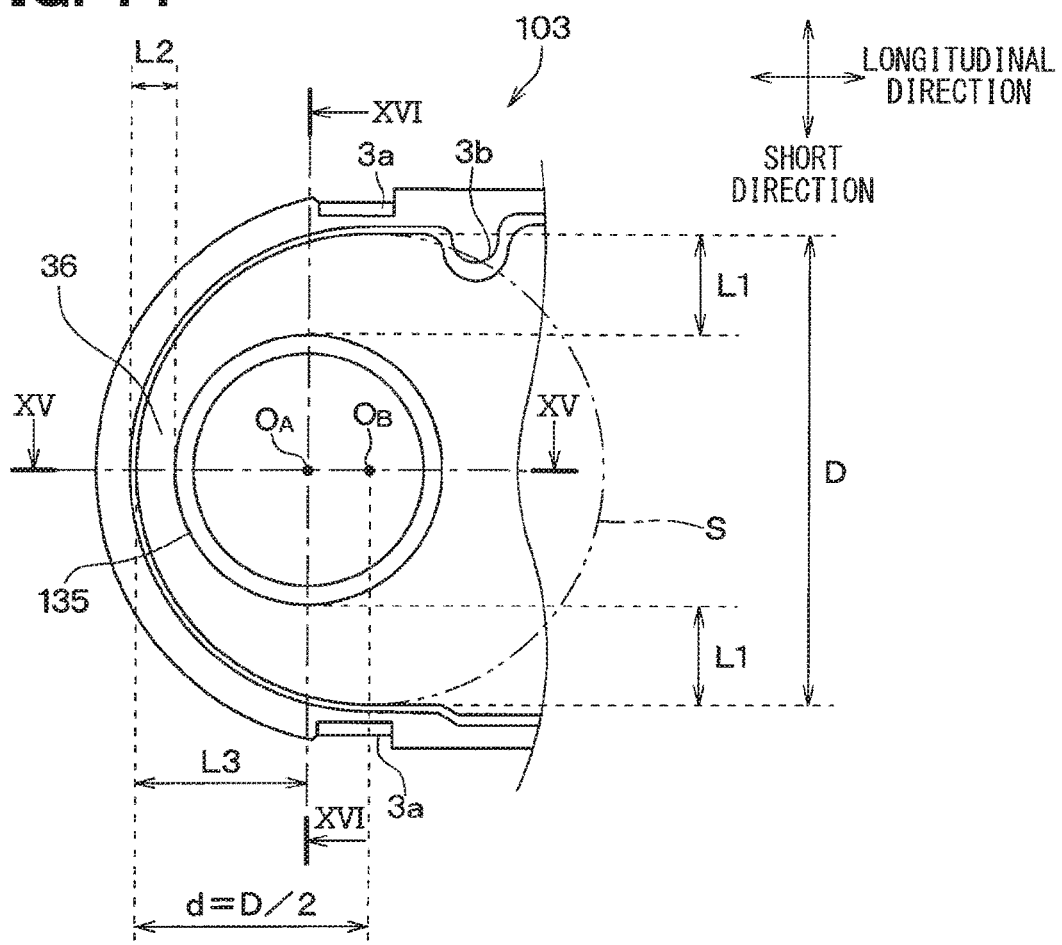
FIG. 14 is a top view to illustrate a main portion of an end part in a longitudinal direction of a flow pipe according to the fifth embodiment.

Next, a structure specific to the flow pipe 103 of the present embodiment will be described by using FIG. 14 to FIG. 16. Here, FIG. 14 shows a main portion of the flow pipe 103 (end side in the longitudinal direction).

The protruding pipe part 135 of the present embodiment is arranged on both sides in the longitudinal direction in the flow pipe 103. The protruding pipe part 135 of the present embodiment is arranged in the flow pipe 103 in such a way that, as shown in FIG. 14, the shortest distance L1 from the peripheral edge part in the short direction to the protruding pipe part 135 is made longer than the shortest distance L2 from the peripheral edge part in the longitudinal direction to the protruding pipe part 135.

In this way, a region from the peripheral edge part in the short direction to the protruding pipe part 135 in the flow pipe 103 is expanded more than a region from the peripheral edge end part (end part on the left side of the paper) in the longitudinal direction to the protruding pipe part 135 in the flow pipe 103. The root part of the protruding pipe part 135 in the flow pipe 103 is a region in which the flow pipe 103 receives the compressive load in the stacking direction, so that expanding the region from the peripheral edge part in the short direction to the protruding pipe part 135 in the flow pipe 103 means expanding the region in which the flow pipe 103 receives the compressive load in the stacking direction.

Here, the shortest distance L2 from the peripheral edge part in the longitudinal direction to the protruding pipe part 135 is set within a range in which, when the compressive load is applied to the flow pipe 103 in the stacking direction, a damage such as a crack or a break is not caused in the region from the peripheral edge end part (end part on the left side of the paper) in the longitudinal direction to the protruding pipe part 135 in the flow pipe 103. In this regard, in the protruding pipe part 135 of the present embodiment, an outside diameter of a section orthogonal to the longitudinal direction is a value (=D−2×L1) acquired by subtracting a value of two times the shortest distance L1 (=2×L1) from a distance D in the short direction of the pair of peripheral edge parts extended in the longitudinal direction in the flow pipe 103.

Further, the protruding pipe part 135 is formed in an eccentric structure in which a center OA of a section in a direction orthogonal to the stacking direction comes near to the peripheral edge end part (arc-shaped portion) in the longitudinal direction of the flow pipe 103. Specifically, the protruding pipe part 135 is arranged in the flow pipe 103 in such a way that the shortest distance L3 from the center OA of the section to the peripheral edge part in the longitudinal direction of the flow pipe 103 is shorter than a half d (=D/2) of the distance D in the short direction of the pair of peripheral edge parts extended in the longitudinal direction in the flow pipe 103.

When an imaginary circle S along the peripheral edge end part (arc-shaped portion) in the longitudinal direction of the flow pipe 103 is drawn, the protruding pipe part 135 of the present embodiment is arranged in the flow pipe 103 in such a way that a center OA of a section of the protruding pipe part 135 comes nearer to the peripheral edge end side in the longitudinal direction of the flow pipe 103 than a center OB of the imaginary circle S. In this regard, the imaginary circle S is a circle the diameter of which is the distance D in the short direction of the pair of peripheral edge parts extended in the longitudinal direction in the flow pipe 103.

Figure 15:
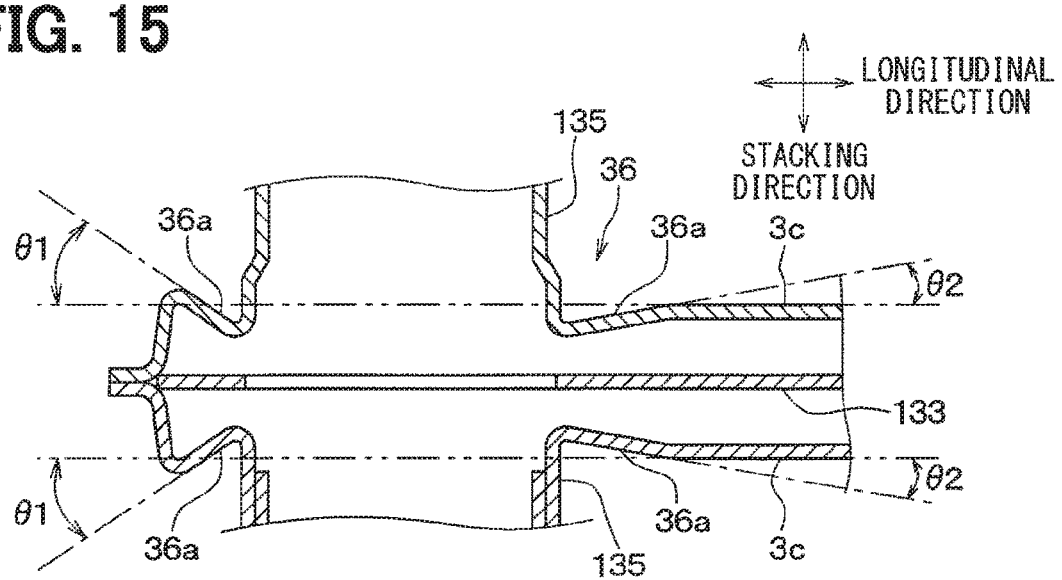
FIG. 15 is a section view taken on a line XV-XV in FIG. 14.
Figure 16:
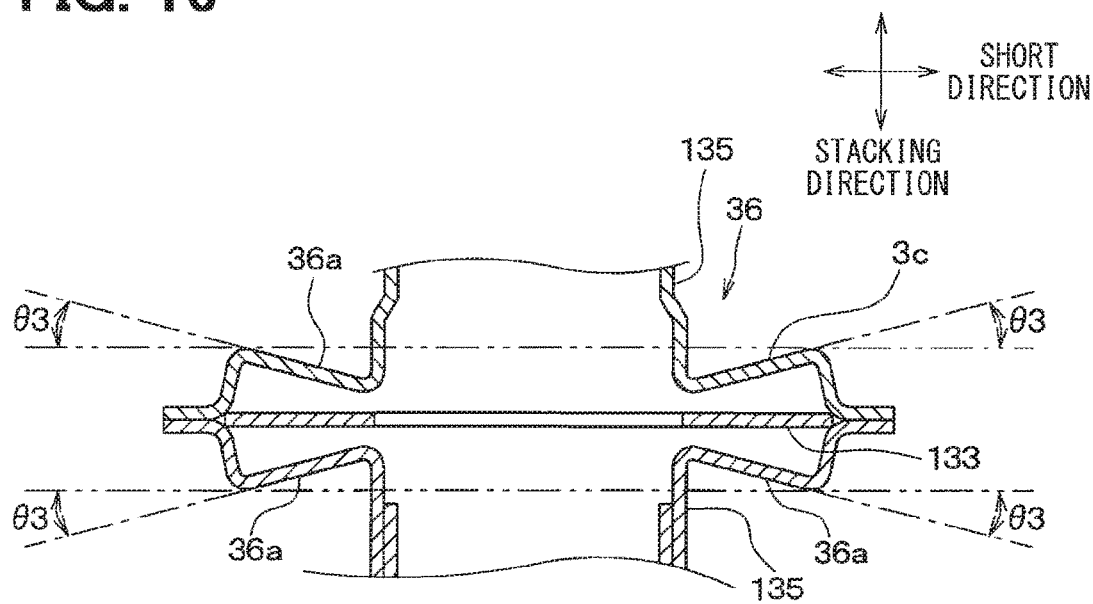
FIG. 16 is a section view taken on a line XVI-XVI in FIG. 14.

Here, FIG. 15 is a section view when the flow pipe 103 is cut at a XV-XV line shown in FIG. 14 in the stacking direction, and FIG. 16 is a section view when the flow pipe 103 is cut at a XVI-XVI line shown in FIG. 14 in the stacking direction.

As described above, in order to bring the electronic parts 102 into close contact with the flow pipes 103, the stacked cooler 101 is formed in a structure in which the compressive load is applied to the electronic parts 102 and the flow pipes 103 in the stacking direction in a state in which the electric parts 102 are arranged in the spaces formed between the adjacent flow pipes 103, whereby the electronic parts 102 are sandwiched by both surfaces of the flow pipes 103. At this time, in the flow pipe 103, the diaphragm part 36 which forms the root part of the protruding pipe part 135 is deformed to the inside by a pressing force, whereby an inclined surface 36a opposite to the protruding pipe part 135 is formed.

The pressing force is most greatly applied to a region in which a distance from the peripheral edge part of the flow pipe 103 to the protruding pipe part 135 becomes shortest and is gradually decreased toward a region (region in which a distance from the peripheral edge part in the longitudinal direction to the protruding pipe part 135 becomes longest) opposite to the above region.

For this reason, in the diaphragm part 36, a bending angle θ1 formed by the inclined surface 36a, which is formed in a region in which a distance from the peripheral edge part in the longitudinal direction to the protruding pipe part 135 becomes shortest, and the flat plane 3c becomes larger than a bending angle θ2 in a region opposite to the region (θ1>θ2). In this regard, the bending angle θ is an angle (acute angle) in which the inclined surface 36a formed on the diaphragm part 36 is inclined with respect to a direction orthogonal to the stacking direction.

Further, in the diaphragm part 36, a bending angle θ3 in a region in which a distance from the peripheral edge part in the short direction to the protruding pipe part 135 becomes shortest is smaller than the bending angle θ1 in the region in which the distance from the peripheral edge part in the longitudinal direction to the protruding pipe part 135 becomes shortest (θ1>θ3). In this regard, the bending angle θ3 in the region in which the distance from the peripheral edge part in the short direction to the protruding pipe part 135 becomes shortest is larger than the bending angle θ2 in a region in which a distance from the peripheral edge part in the longitudinal direction to the protruding pipe part 135 becomes longest (θ1>θ3>θ2).

In the stacked cooler 101 constituted in this way, the heat transfer medium introduced from the medium introduction part 4 flows in from one end part side in the longitudinal direction of each flow pipe 103 via the supply header part 111 and flows toward the other end part side in the medium passage 30 of each flow pipe 103. Then, the heat transfer medium flowing in the medium passage 30 is discharged from the medium discharge part 105 via the discharge header part 12. At this time, the respective electronic parts 102 sandwiched by the flat planes 3c of the respective flow pipes 103 exchange heat with the heat transfer medium flowing in the medium passage 30, thereby being cooled.

Next, the operation and effect of the stacked cooler 101 constituted in the above manner will be described.

The stacked cooler 101 of the present embodiment, as shown in FIG. 14, the shortest distance L1 from the peripheral edge part in the short direction of the flow pipe 103 to the protruding pipe part 135 is longer than the shortest distance L2 from the peripheral edge part in the longitudinal direction of the flow pipe 103 to the protruding pipe part 135 (L1>L2).

According to this, a region from the peripheral edge part in the short direction of the flow pipe 103 to the protruding pipe part 135, that is, a region in which the flow pipe 103 receives the compressive load applied in the stacking direction can be expanded. At this time, a region from the peripheral edge part in the longitudinal direction of the flow pipe 103 to the protruding pipe part 135 does not need to be expanded, so that the flat plane 3c extended in the longitudinal direction of the flow pipe 103, that is, the heat exchange region in which the electronic part 102 exchanges heat with the heat transfer medium can be secured.

Here, the effect of the flow pipe 103 of the present embodiment will be described by using the flow pipe 103 of the present embodiment shown on an upper side in FIG. 17 and a flow pipe 3' of a comparative example shown on a lower side in FIG. 17. In this regard, it is assumed that, in the flow pipe 3' of the comparative example, an outside diameter of a section orthogonal to a longitudinal direction of a protruding pipe part 35' is a value (=D−2×L2) acquired by subtracting a value (=2×L2) of two times the shortest distance L2 from a length D in a short direction of a pair of peripheral edge parts extended in the longitudinal direction in the flow pipe 3'.

Figure 17:
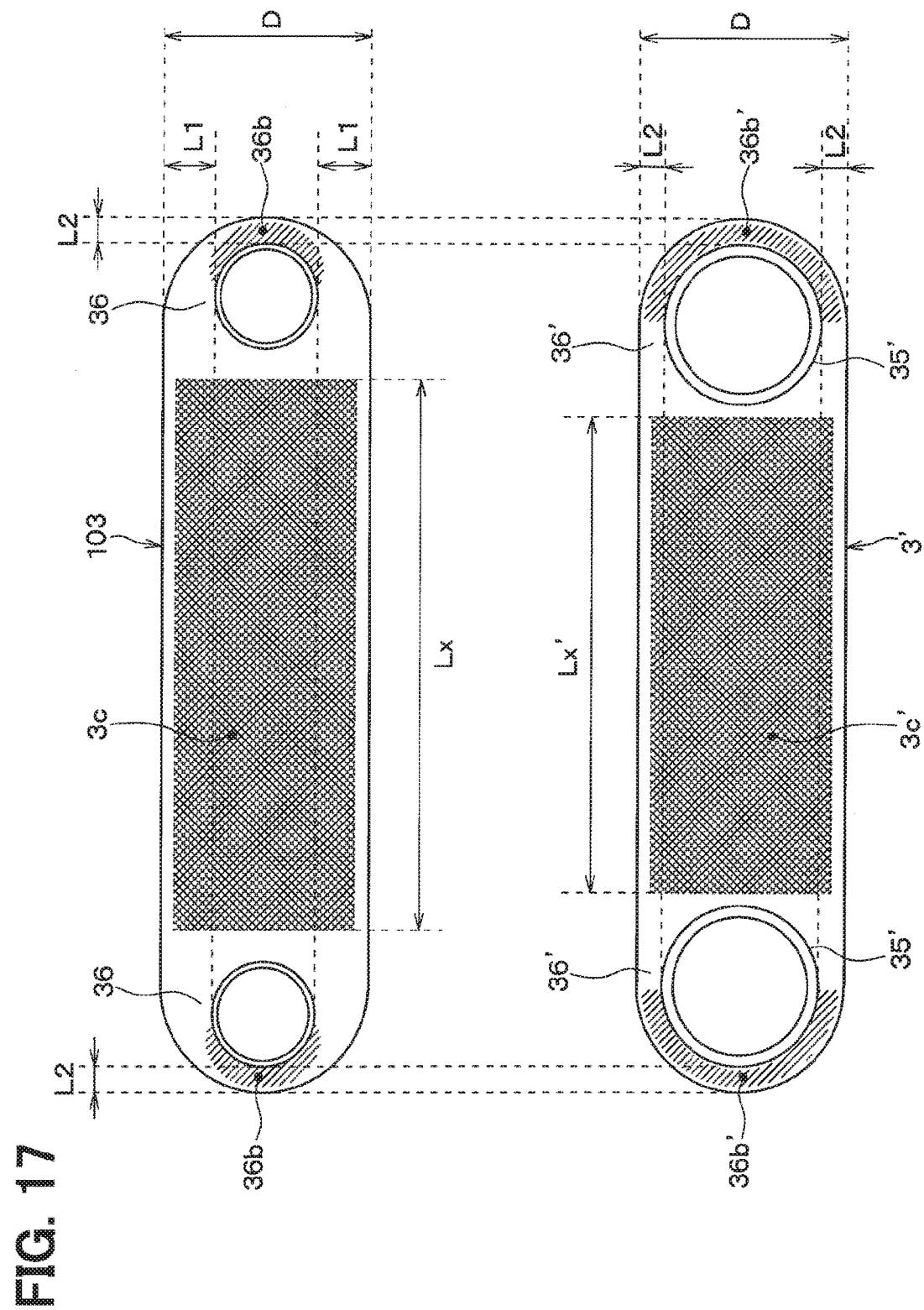
FIG. 17 is a diagram to illustrate an operation and effect of a flow pipe according to the fifth embodiment.

In the flow pipe 3' of the comparative example, when a compressive load in the stacking direction is applied to the flow pipe 3', the largest load is applied to a semicircular shaded region 36b' shown in FIG. 17 of a diaphragm part 6' surrounding a root part of the protruding pipe part 35'. Then, when a load is applied to the flow pipe 3' from various directions by vibrations or the like, a fatigue failure or the like tends to be easily caused in the semicircular shaded region 36b'.

In contrast to this, in the flow pipe 103 of the present embodiment, when a compressive load in the stacking direction is applied to the flow pipe 103, the largest load is applied to a shaded region 36b of an end portion in the longitudinal direction shown in FIG. 17 of the diaphragm part 36 to surround the root part of the protruding pipe part 135.

The shaded region 36b of the flow pipe 103 of the present embodiment, as shown in FIG. 17, is smaller in area than the shaded region 36b' of the flow pipe 3' of the comparative example, so that a fatigue failure or the like by vibrations or the like is not frequently caused in the shaded region 36b of the flow pipe 103 as compared with the flow pipe 3' of the comparative example.

Further, in the flow pipe 3' of the comparative example, an outside diameter of a section orthogonal to the longitudinal direction of the protruding pipe part 35' is a value (=D−2×L2) acquired by subtracting a value (=2×L2) of two times the shortest distance L2 from a length D in the short direction of the pair of peripheral edge parts extended in the longitudinal direction in the flow pipe 3'.

In contrast to this, in the flow pipe 103 of the present embodiment, an outside diameter of a section orthogonal to the longitudinal direction of the protruding pipe part 135 is a value (=D−2×L1) acquired by subtracting a value (=2×L1) of two times the shortest distance L1 from a length D in the short direction of the pair of peripheral edge parts extended in the longitudinal direction in the flow pipe 103. Then, in the flow pipe 103 of the present embodiment, the protruding pipe part 135 is constituted so as to be eccentric in such a way that a center of a section comes near to the peripheral edge part side in the longitudinal direction.

According to this, a length Lx in the longitudinal direction of the flat plane 3c in the flow pipe 103 can be made longer than a length Lx' in the longitudinal direction of a flat plane 3c' in the flow pipe 3' of the comparative example. In this way, in the present embodiment, a region occupied by the flat plane 3c in the flow pipe 103 can be made larger than a region occupied by the flat plane 3c' in the flow pipe 3' of the comparative example.

By the way, the flat plane 3c of the flow pipe 103 is a portion with which the electronic part 102 is brought into close contact and hence is increased in pressure resistance than the other portion. As described above, in the flow pipe 103 of the present embodiment, the region of the flat plane 3c can be expanded as compared with the flow pipe 3' of the comparative example. Hence, as the region of the flat plane 3c is expanded, the flow pipe 103 is improved in the pressure resistance. In other words, in the present embodiment, the stacked cooler 101 as a whole can be improved in the pressure resistance.

Further, a portion itself in which a bending angle θ formed by the inclined surface 36a and the flat plane 3c in the diaphragm part 36 is large becomes a flow resistance to inhibit a flow of the heat transfer medium flowing into the respective flow pipes 103 and a flow of the heat transfer medium flowing out of the respective flow pipes 103.

Still further, in the portion in which the bending angle θ, which is formed by the inclined surface 36a and the flat plane 3c in the diaphragm part 36, is large, when the compressive load is applied to the flow pipe 103 in the stacking direction, a reaction force opposed to the compressive load becomes large. This reaction force is applied in a direction to separate the flat plane 3c of the flow pipe 103 from the electronic part 102, so the reaction force causes to reduce the close contact of the flat plane 3c of the flow pipe 103 and the electronic part 102.

In contrast to this, in the flow pipe 103 of the present embodiment, as shown in FIG. 15 and FIG. 16, a bending angle θ3, which is formed by the inclined surface 36a formed at the root part on the peripheral edge part side in the short direction and the flat plane 3c, is smaller than a bending angle θ1, which is formed by the inclined surface 36a formed at the root part on the peripheral edge part side in the longitudinal direction and the flat plane 3c.

If the bending angle θ on the peripheral edge part side in the short direction in the diaphragm part 36 is made small in this way, the flow resistance of the flow of the heat transfer medium on the peripheral edge side in the short direction in the diaphragm part 36 can be made small. As the result, the heat transfer medium can easily flow into the respective flow pipes 103 from the peripheral edge part side in the short direction in the diaphragm part 36 and can easily flow out to the peripheral edge part side in the short direction in the diaphragm part 36 from the respective flow pipes 103.

Further, If the bending angle θ3 on the peripheral edge part side in the short direction in the diaphragm part 36 is made small, when the compressive load is applied to the flow pipe 103 in the stacking direction, the reaction force applied to the peripheral edge side in the short direction in the diaphragm part 36 can be made small. As the result, it is possible to restrain the close contact of the flat plane 3c of the flow pipe 103 and the electronic part 102 from being reduced.

Here, the flow of the heat transfer medium in the flow pipe 103 of the present embodiment will be described by using the flow pipe 103 of the present embodiment shown in FIG. 18 and the flow pipe 3' of the comparative example shown in FIG. 19. In this regard, it is assumed that in the flow pipe 3' of the comparative example, the outside diameter of a section orthogonal to the longitudinal direction of the protruding pipe part 35' is a value acquired by subtracting a value of two times the shortest distance L2 from the length D in the short direction of the pair of peripheral edge parts extended in the longitudinal direction in the flow pipe 3'.

Figure 18:
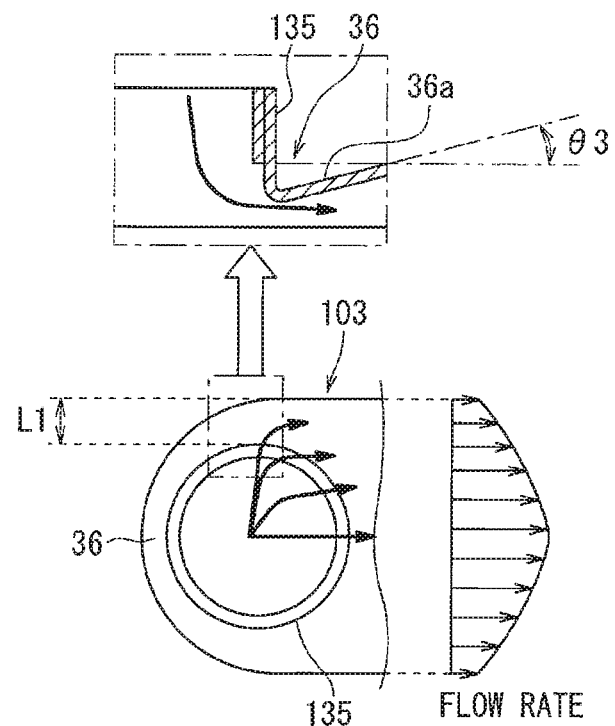
FIG. 18 is a diagram to illustrate a way in which a heat medium flows in a flow pipe according to the fifth embodiment.
Figure 19:
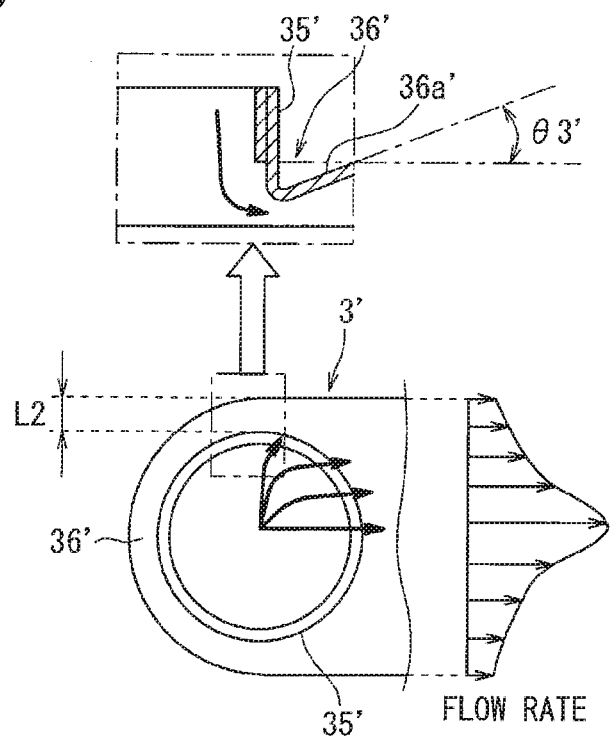
FIG. 19 is a diagram to illustrate a way in which a heat medium flows in a flow pipe according to a comparative example.

In the flow pipe 103 of the present embodiment, as shown in FIG. 18 and FIG. 19, the bending angle θ3 on the peripheral edge part side in the short direction in the diaphragm part 36 is smaller than the bending angle θ3' of the same portion in the flow pipe 3' of the comparative example. In this regard, the bending angle θ3' on the peripheral edge part side in the short direction in the diaphragm part 36' of the flow pipe 3' is as large as the bending angle θ1 on the peripheral edge part side in the longitudinal direction in the diaphragm part 36 of the flow pipe 103 of the present embodiment.

For this reason, in the flow pipe 103 of the present embodiment, the heat transfer medium can easily flow into the respective flow pipes 103 from the peripheral edge part side in the short direction in the diaphragm part 36 as compared with the flow pipe 3' of the comparative example. In this way, in the flow pipe 103 of the present embodiment, it is possible to restrain the heat transfer medium from being reduced in flow rate in the short direction (flow rate distribution) in the medium passage 30 as compared with the flow pipe 3' of the comparative example (see flow rate distribution shown on the right side in FIG. 18 and FIG. 19).

In this way, in the stacked cooler 101 of the present embodiment, it is possible to restrain the flow rate distribution in the medium passage 30 of each flow pipe 103. Hence, in the flow pipe 103, it is possible to make the electronic part 102 suitably exchange heat with the heat transfer medium.

Further, in the flow pipe 103 of the present embodiment, the peripheral edge end part in the longitudinal direction is formed in the shape of the arc. Further, as shown in FIG. 14, the center OA of the section in a direction orthogonal to the stacking direction in the protruding pipe part 135 is positioned closer to the peripheral edge end part in the longitudinal direction in the flow pipe 103 than the center OB of the arc of the peripheral edge end part in the longitudinal direction in the flow pipe 103.

Figure 20:
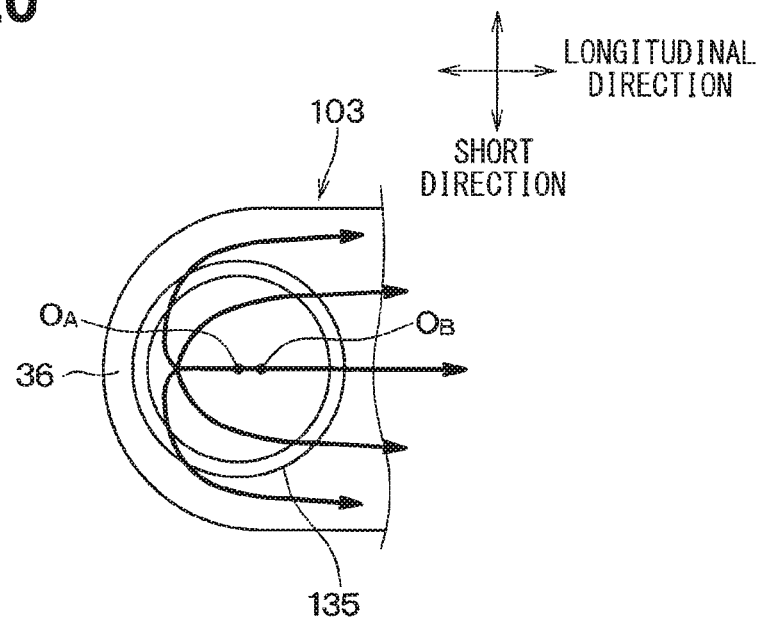
FIG. 20 is a diagram to illustrate a way in which the heat medium flows in the flow pipe according to the fifth embodiment.

According to this, as shown in FIG. 20, the heat transfer medium flowing to the peripheral edge part side in the short direction of the protruding pipe part 135 can easily flow in one direction (to the right side on the paper) from an inlet side to an outlet side of the medium passage 30 by using the peripheral edge part formed in the shape of the arc in the short direction in the flow pipe 103 as a guide part.

Figure 21:
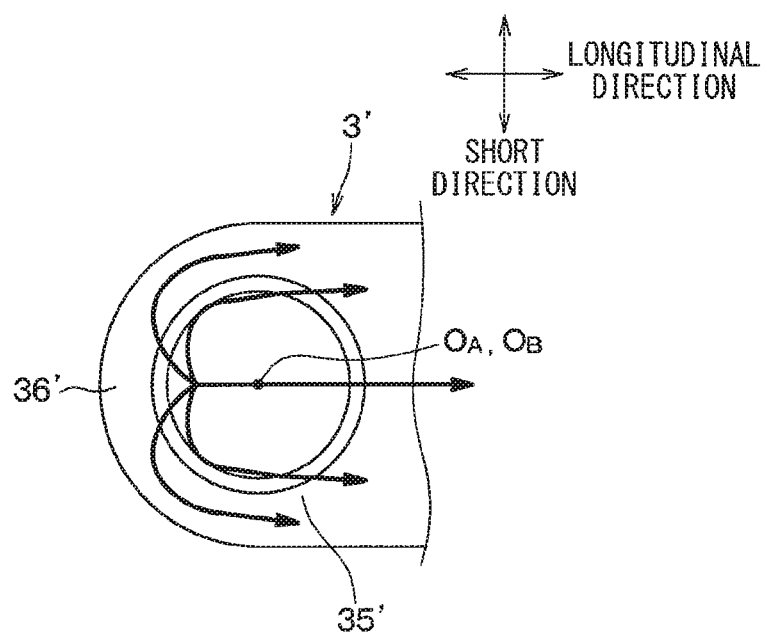
FIG. 21 is a diagram to illustrate a way in which the heat medium flows in the flow pipe according to the comparative example.

Here, FIG. 21 shows a flow pipe 3' which has a protruding pipe part 35' having the same section diameter as the protruding pipe part 135 shown in FIG. 20 and which is located at the same position as the center OB of the arc of the peripheral edge end part in the longitudinal direction in the flow pipe 103. In this regard, FIG. 21 is the flow pipe 3' that is a comparative example of the flow pipe 103 of the present embodiment.

In the flow pipe 3' shown in FIG. 21, the heat transfer medium flowing to the peripheral edge part side in the short direction of the protruding pipe part 135 can easily flow in the shape of a letter U on the inlet side of the medium passage 30 along the peripheral edge part formed in the shape of the arc in the longitudinal direction by using the peripheral edge part formed in the shape of the arc in the longitudinal direction in the flow pipe 103 as a guide part. In this way, it is not preferable that the heat transfer medium turns its flow in the shape of the letter U, because a flow rate distribution in the flow pipe 103 is increased.

In contrast to this, in the flow pipe 103 of the present embodiment, as described above, the heat transfer medium can easily flow in the one direction (to the right side on the paper) from the inlet side to the outlet side of the medium passage 30, which hence can reduce the flow rate distribution in the flow pipe 103. As the result, in the flow pipe 103, it is possible to make the electronic part 102 suitably exchange heat with the heat transfer medium.

Further, the flow pipe 103 of the present embodiment is constituted so as to join the pair of outer shell plates 131, 132, which constitute its outer shell, to each other by the brazing material arranged on their insides. The brazing material is collected in a fused state in the peripheral edge parts of the join portion of the pair of outer shell plates 131, 132 and then is cured in a manufacturing process of the flow pipe 103, whereby the peripheral edge parts of the pair of outer shell plates 131, 132 are joined to each other.

Figure 22:
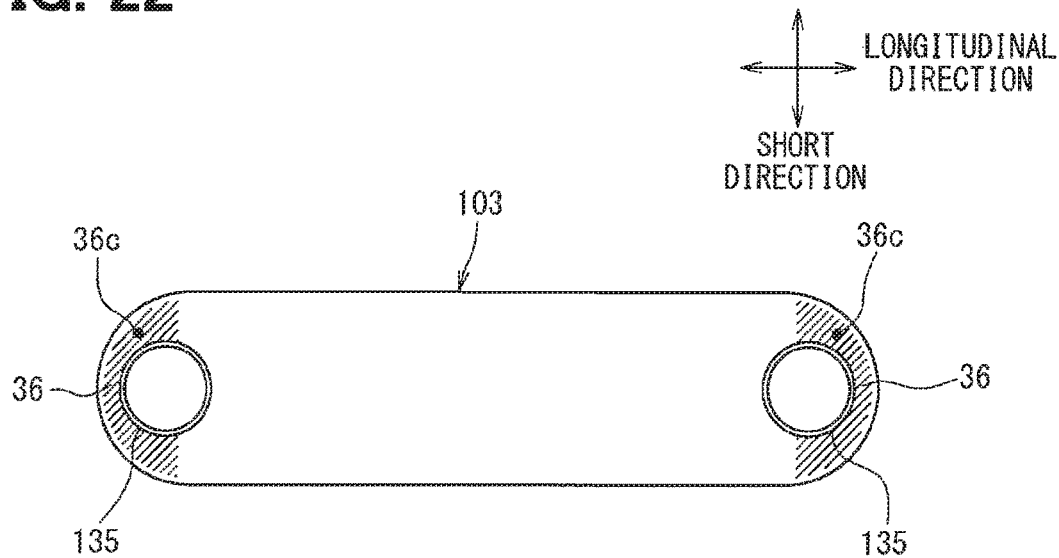
FIG. 22 is a top view to illustrate a region in which a brazing material is arranged in the flow pipe according to the fifth embodiment.

As described above, the flow pipe 103 of the present embodiment is constituted in such a way that the region from the peripheral edge part in the short direction of the pipe 103 to the protruding pipe part 135 is expanded. As the result, as shown in FIG. 22, an area of each of portions 36c (shaded portions in FIG. 22) is also expanded in which the brazing material is arranged in the periphery of the protruding pipe part 135 of the pair of outer shell plates 131, 132.

For this reason, the amount of the brazing material to be collected in the join portion of the pair of outer shell plates 131, 132 can be increased in the manufacturing process of the flow pipe 103 by expanding the region from the peripheral edge part in the short direction of the pipe 103 to the protruding pipe part 135. As the result, the outer shell plates 131, 132 can be more reliably joined to each other.

Further, the flow pipe 103 of the present embodiment, as shown in FIG. 10, is constituted in such a way that the rib 3b for positioning the edge part in the longitudinal direction of the inner fin 134 is formed in the peripheral edge part extended in the longitudinal direction in the flow pipe 103. As described above, the flow pipe 103 of the present embodiment is constituted so as to expand the region from the peripheral edge part in the short direction of the flow pipe 103 to the protruding pipe part 135. For this reason, a distance from the rib 3b to the protruding pipe part 135 can be sufficiently ensured, which hence can restrain the rib 3b from affecting the deformation of the diaphragm part 36 to form the root part of the protruding pipe part 135.

Still further, the flow pipe 103 of the present embodiment is constituted so as to have the claw parts 3a to reinforce the joining of the peripheral edge parts in the pair of outer shell plates 131, 132 from the outside. As described above, the flow pipe 103 of the present embodiment is constituted in such a way that the region from the peripheral edge part in the short direction of the flow pipe 103 to the protruding pipe part 135 is expanded. For this reason, a distance from the claw part 3a to the protruding pipe part 135 can be sufficiently ensured as is the case with the rib 3b. Hence it is possible to restrain the claw part 3a from affecting the deformation of the diaphragm part 36 to form the root part of the protruding pipe part 135.

Sixth Embodiment

Next, a sixth embodiment will be described. In the present embodiment, an example will be described in which the shape of the flow pipe 103 is changed. In this regard, the descriptions of the parts equal or equivalent to the fifth embodiment will be omitted or simplified.

Figure 23:
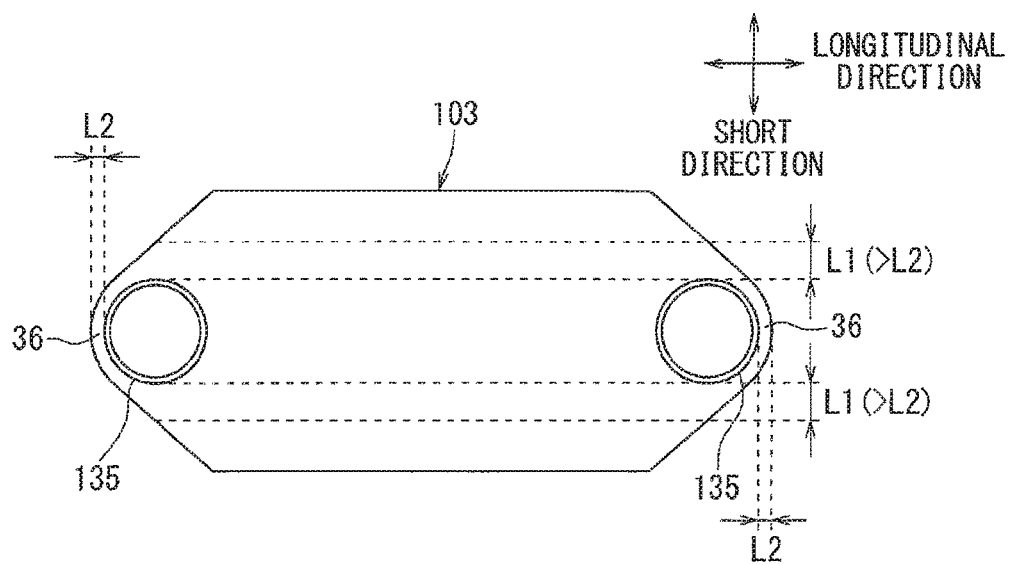
FIG. 23 is a top view of a flow pipe according to a sixth embodiment.

In the flow pipe 103 of the present embodiment, as shown in FIG. 23, the shape of the peripheral edge end part in the longitudinal direction is formed not in the shape of a semi-circular arc but in the shape of a triangle. In this regard, in the flow pipe 103, an outermost vertex portion of the peripheral edge end part in the longitudinal direction side is formed in a round shape so as to draw an arc.

The other configurations and operations are the same as those in the fifth embodiment. In the flow pipe 103 of the present embodiment, the shortest distance from the peripheral edge part in the short direction of the flow pipe 103 to the protruding pipe part 135 is longer than the shortest distance L2 from the peripheral edge part in the longitudinal direction of the flow pipe 103 to the protruding pipe part 135. Hence, also in the stacked cooler 101 of the present embodiment, the same effect as the effect described in the fifth embodiment can be produced.

In this regard, the shape of the peripheral edge end part in the longitudinal direction in the flow pipe 103 may be formed in a shape other than the semicircular arc or the triangle if the shape can make the shortest distance from the peripheral edge part in the short direction to the protruding pipe part 135 longer than the shortest distance L2 from the peripheral edge part in the longitudinal direction to the protruding pipe part 135.

Up to this point, the embodiments have been described. However, the present disclosure is not limited to the embodiments described above but can be variously modified within a scope claimed in the claims. For example, the present disclosure can be variously modified as described below.

Figure 24:
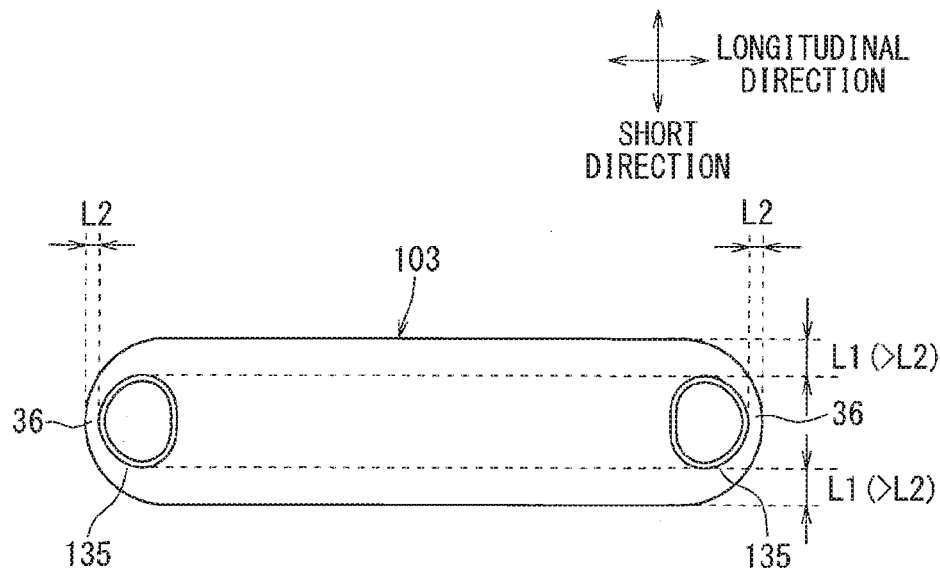
FIG. 24 is a top view of a flow pipe according to a first modified example.

(1) In the respective embodiments described above the examples have been described in which the flow pipe 103 is provided with the cylindrical protruding pipe part 135. However, the present disclosure is not limited to this but, for example, as shown in FIG. 24, the flow pipe 103 may be provided with a cylindrical protruding pipe part 135 the section of which is oval.

Figure 25:
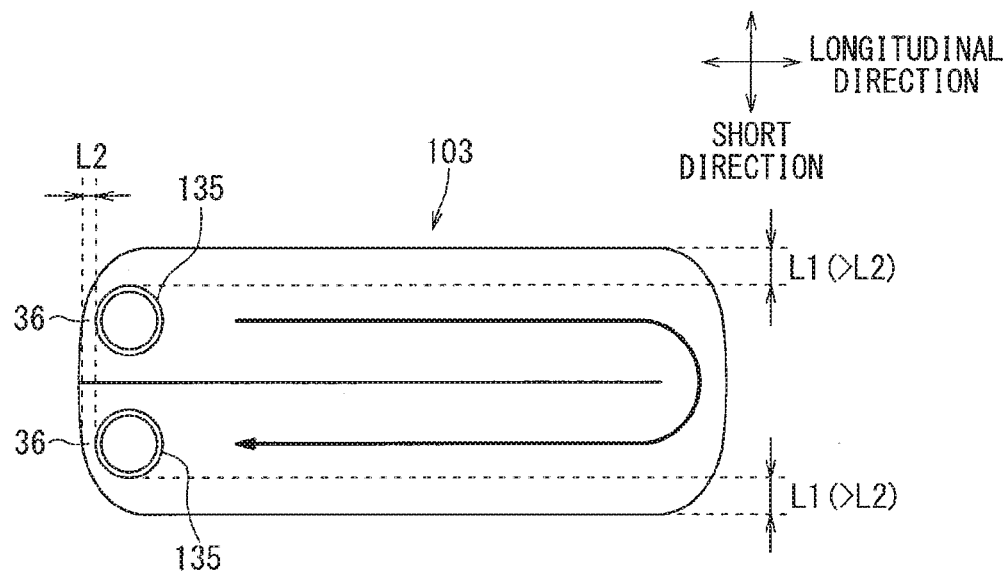
FIG. 25 is a top view of a flow pipe according to a second modified example.
Figure 26:
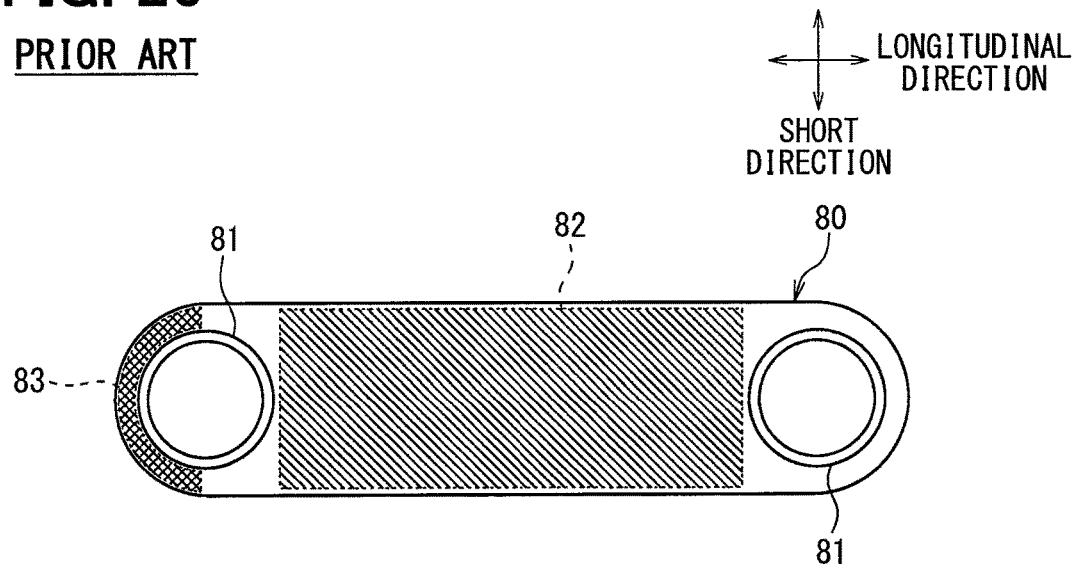
FIG. 26 is a diagram to illustrate a problem.
Figure 27:
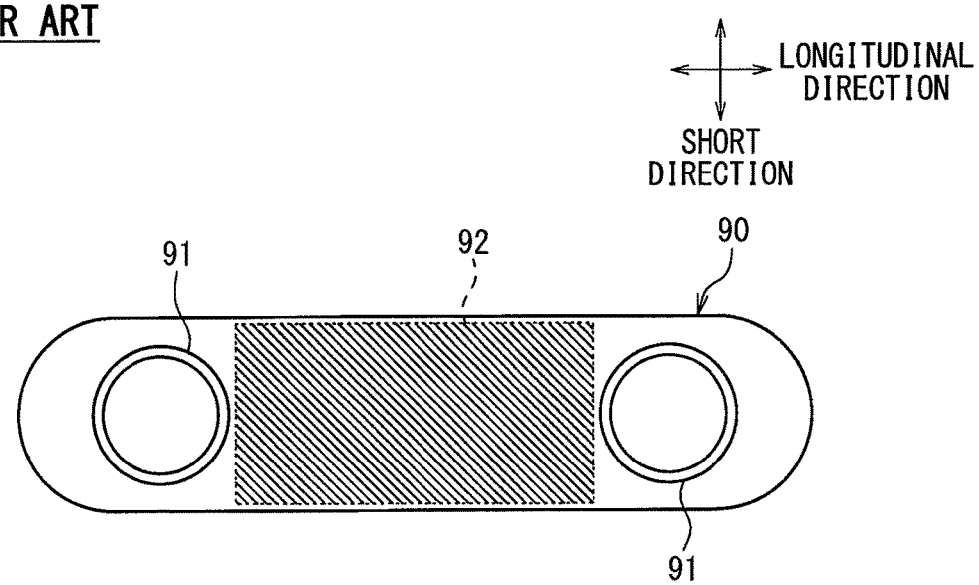
FIG. 27 is a diagram to illustrate a problem.

(2) In the respective embodiments described above the examples have been described in which the flow pipe 103 has the pair of protruding pipe parts 135 provided on both end sides in the longitudinal direction thereof. However, the present disclosure is not limited to this but, for example, as shown in FIG. 25, the flow pipe 103 may have a U-shaped medium passage 30 formed therein and may have the pair of protruding pipe part 135 provided on one end part in the longitudinal direction thereof.

(3) In the respective embodiments described above the examples have been described in which the flow pipe 103 has the middle plate 133 arranged therein and in which the flow pipe 103 has two rows of medium passages 30 arranged therein. However, the present disclosure is not limited to this but, for example, the middle plate 133 may be omitted and the flow pipe 103 may have one row of medium passage 30 arranged therein. Alternatively, the flow pipe 103 may have two or more middle plates 133 arranged therein and may have three or more rows of medium passages 30 arranged therein.

(4) In the respective embodiments described above the examples have been described in which the flow pipe 103 has the inner fins 134 arranged therein. However, the present disclosure is not limited to this but the inner fins 134 may be omitted.

(5) In the respective embodiments described above the examples have been described in which the peripheral edge parts of the pair of outer shell plates 131, 132 are joined to each other by the brazing material to thereby form the flow pipe 103. However, the present disclosure is not limited to this, but the flow pipe 103 may be formed by joining the peripheral edge parts of the pair of outer shell plates 131, 132 by a joining material other than the brazing material.

(6) As described above, it is preferable that the flow pipe 103 is provided with the claw parts 3a for reinforcing the joining of the peripheral edge parts of the pair of outer shell plates 131, 132 from the outside. However, the present disclosure is not limited to this but the claw parts 3a may be omitted.

(7) In the respective embodiments described above the examples have been described in which the stacked cooler of the present disclosure is applied to a cooler to cool the electronic part 102. However, the present disclosure is not limited to this, that is, the stacked cooler of the present disclosure may be applied to a cooler to cool a part other than the electronic part 102 or a heater to heat the part.

(8) In the respective embodiments described above, needless to say, elements to constitute the embodiments are not always essential except for a case in which the elements are clearly designated to be especially essential or a case in which the elements are thought to be essential in view of principle.

(9) In the respective embodiments described above, in a case in which a numerical value of the number, the numerical value, the amount, or the range of the constituent element of the embodiment is referred to, except for a case in which the numerical value is clearly designated to be especially essential or a case in which the numerical value is limited to a specific number in view of principle, the present disclosure is not limited to the specific numerical value.

(10) In the respective embodiments described above, when a shape, a position relationship, or the like of the constituent element or the like is referred to, except for a case in which a shape, a position relationship, or the like is specifically specified and a case in which the shape, the position relationship, or the like is limited to a specific shape or a specific relationship, or the like in view of principle, the present disclosure is not limited to the specific shape, the specific position relationship, or the like.

While the present disclosure has been described with reference to the embodiments thereof, it is to be understood that the present disclosure is not limited to the embodiments and constructions. The present disclosure is intended to cover various modifications and equivalent arrangements. In addition, while the various combinations and configurations, other combinations and configurations, including more, less or only a single element, are also within the spirit and scope of the present disclosure.

The invention claimed is:

1. A stacked cooler comprising:
a heat exchange part that includes a plurality of flow pipes arranged side by side, such that each adjacent two of the plurality of flow pipes are coupled together and define therebetween a space such that a heat exchange object is disposed therein, wherein each of the plurality of flow pipes includes a medium passage in which a heat medium flows;
a refrigerant introduction pipe for introducing refrigerant into the medium passage;
a refrigerant discharge pipe for discharging the refrigerant from the medium passage, wherein the refrigerant introduction pipe and the refrigerant discharge pipe extend out in a stacking direction of the plurality of flow pipes from a front end cooling pipe of the plurality of flow pipes that is located at their front end, which is one end in the stacking direction;
a rigidity improving part that improves a rigidity of the front end cooling pipe, wherein:
the front end cooling pipe includes:
a front outer shell plate that is disposed on its front side; and
a rear outer shell plate that is disposed on its rear side and is joined to the front outer shell plate to define a space serving as the medium passage between the rear outer shell plate and the front outer shell plate;
the refrigerant introduction pipe and the refrigerant discharge pipe are joined to the front outer shell plate; and
the rigidity improving part includes a reinforcing plate overlaid on the front end cooling pipe, wherein the reinforcing plate includes a join part that is joined around each of connection parts of the front end cooling pipe to the refrigerant introduction pipe and the refrigerant discharge pipe,
the front end cooling pipe includes an engaging claw, and the reinforcing plate includes an engaged part that engages with the engaging claw, so that the reinforcing plate is temporarily held by the front end cooling pipe.

2. The stacked cooler according to claim 1, wherein the reinforcing plate includes a protruding part, which protrudes toward the front end cooling pipe, at the join part.

3. The stacked cooler according to claim 1, wherein:
   the reinforcing plate includes a thin part between the join part and the engaged part; and
   the thin part is formed to have a thickness smaller than a thickness of the join part.

4. The stacked cooler according to claim 1, wherein each of the join parts are C-shaped.

* * * * *